US011824502B2

(12) United States Patent
Eklund et al.

(10) Patent No.: US 11,824,502 B2
(45) Date of Patent: Nov. 21, 2023

(54) DIGITAL PREDISTORTION LOW POWER IMPLEMENTATION

(71) Applicant: Telefonaktiebolaget LM Ericsson (publ), Stockholm (SE)

(72) Inventors: Kristian Eklund, Dalby (SE); Asad Jafri, Malmö (SE); Jessica Chani, Malmö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 534 days.

(21) Appl. No.: 16/972,963

(22) PCT Filed: Jun. 5, 2018

(86) PCT No.: PCT/EP2018/064705
§ 371 (c)(1),
(2) Date: Dec. 7, 2020

(87) PCT Pub. No.: WO2019/233555
PCT Pub. Date: Dec. 12, 2019

(65) Prior Publication Data
US 2021/0249997 A1 Aug. 12, 2021

(51) Int. Cl.
*H03F 1/32* (2006.01)
*H03F 3/19* (2006.01)

(52) U.S. Cl.
CPC ............. *H03F 1/3247* (2013.01); *H03F 3/19* (2013.01); *H03F 2200/451* (2013.01); *H03F 2201/3215* (2013.01); *H03F 2201/3233* (2013.01)

(58) Field of Classification Search
CPC ........................................................ H03F 1/32
(Continued)

(56) References Cited

U.S. PATENT DOCUMENTS

| 5,528,532 | A | 6/1996 | Shibutani | |
|---|---|---|---|---|
| 6,798,843 | B1 * | 9/2004 | Wright | H03F 1/3294 330/149 |
| 8,558,615 | B2 * | 10/2013 | Li | H03F 1/3247 330/149 |

(Continued)

FOREIGN PATENT DOCUMENTS

| WO | 2016203294 A1 | 12/2016 |
|---|---|---|
| WO | 2019233558 A1 | 12/2019 |

OTHER PUBLICATIONS

Examination Report for Indian Patent Application No. 202147000030, dated Jan. 3, 2022, 5 pages.

(Continued)

*Primary Examiner* — Henry Choe
(74) *Attorney, Agent, or Firm* — Withrow & Terranova, PLLC

(57) ABSTRACT

Systems comprising a low power Digital Predistortion (DPD) system and methods of operation thereof are disclosed herein. In some embodiments, a system comprises a DPD system for digitally predistorting an input signal to provide an output signal. The DPD system comprises a DPD actuator comprising one or more configurable multiplication functions, each configurable to operate in different power modes. The different power modes comprise a first power mode in which the configurable multiplication function multiplies a first value related to an input sample of the input signal and a second value related to a respective DPD value to provide an output value and a second power mode in which the configurable multiplication function outputs, as the output value, are an approximation of a multiplication of the first value and the second value.

24 Claims, 12 Drawing Sheets

(58) Field of Classification Search
USPC .......................................... 330/149; 375/297
See application file for complete search history.

(56) References Cited

U.S. PATENT DOCUMENTS

| | | | |
|---|---|---|---|
| 11,405,004 B2 | 8/2022 | Jafri et al. | |
| 2004/0208259 A1 | 10/2004 | Hunton | |
| 2005/0001676 A1 | 1/2005 | Saed | |
| 2010/0035554 A1 | 2/2010 | Ba et al. | |
| 2011/0221527 A1* | 9/2011 | Woo | H03F 1/3247 330/149 |
| 2013/0162348 A1* | 6/2013 | Bai | H03F 3/245 330/149 |
| 2014/0122554 A1 | 5/2014 | Hickmann et al. | |
| 2014/0218107 A1* | 8/2014 | Geng | H03F 1/0211 330/149 |
| 2015/0095394 A1 | 4/2015 | Finchelstein et al. | |
| 2015/0349725 A1* | 12/2015 | Hirai | H03F 1/3241 330/149 |
| 2015/0381216 A1 | 12/2015 | Shor et al. | |
| 2015/0381220 A1 | 12/2015 | Gal et al. | |
| 2016/0126903 A1* | 5/2016 | Abdelrahman | H03F 3/19 330/149 |
| 2016/0204809 A1 | 7/2016 | Pratt et al. | |
| 2016/0295219 A1 | 10/2016 | Ye et al. | |
| 2018/0367174 A1* | 12/2018 | Nakamura | H04B 1/0475 |

OTHER PUBLICATIONS

Hashemi, Soheil, et al., "DRUM: A Dynamic Range Unbiased Multiplier for Approximate Applications," IEEE/ACM International Conference on Computer-Aided Design (ICCAD), Austin, TX, 2015, pp. 418-425.

Morgan, Dennis R., et al., "A Generalized Memory Polynomial Model for Digital Predistortion of RF Power Amplifiers," IEEE Transactions on Signal Processing, vol. 54, No. 10, Oct. 2006, pp. 3852-3860.

Narayanamoorthy, Srinivasan, et al., "Energy-Efficient Approximate Multiplication for Digital Signal Processing and Classification Applications," IEEE Transactions on Very Large Scale Integration (VLSI) Systems, vol. 23, No. 6, Jun. 2015, pp. 1180-1184.

International Search Report and Written Opinion for International Patent Application No. PCT/EP2018/064705, dated Feb. 22, 2019, 10 pages.

International Search Report and Written Opinion for International Patent Application No. PCT/EP2018/064727, dated Feb. 25, 2019, 9 pages.

Non-Final Office Action for U.S. Appl. No. 17/867,412, dated Oct. 28, 2022, 8 pages.

Notice of Allowance for U.S. Appl. No. 16/972,933, dated Oct. 21, 2021, 9 pages.

* cited by examiner

DIGITAL PREDISTORTION LOW POWER IMPLEMENTATION

This application is a 35 U.S.C. § 371 national phase filing of International Application No. PCT/EP2018/064705, filed Jun. 5, 2018, the disclosure of which is incorporated herein by reference in its entirety.

TECHNICAL FIELD

The present disclosure relates to Digital Predistortion (DPD).

BACKGROUND

Radio transmitters use a Power Amplifier (PA) to amplify a signal to a desired level for transmission. One important requirement for PA design is the tradeoff between PA efficiency and PA linearization. A high efficiency PA requires Digital Predistortion (DPD) to reduce the non-linear distortion inserted by the PA. DPD is performed by multiplying the signal to be transmitted by complex coefficients to modify both the amplitude and phase characteristics of the signal in such a way that the predistorted signal combined with the non-linear distortion introduced by the PA is linearized. The complex coefficients are calculated by a DPD adaptor using some optimization algorithm to find the optimal solution for the complex coefficients.

The computation intensity, and therefore power consumption, for DPD is high both when utilizing the calculated complex coefficients to predistort the signal to be transmitted and when calculating the complex coefficients to be used for the predistortion. In particular, many complex number additions and multiplications must be performed both when utilizing the calculated complex coefficients to predistort the signal to be transmitted and when calculating the complex coefficients to be used for the predistortion.

While adaptation of the complex coefficients used for DPD is performed rather infrequently, DPD itself is always performed when transmitting a signal. Thus, there is a need for systems and methods for reducing the computational complexity, and thus power consumption requirements, of DPD.

SUMMARY

Systems comprising a low power Digital Predistortion (DPD) system and methods of operation thereof are disclosed herein. In some embodiments, a system comprises a DPD system for digitally predistorting an input signal to provide an output signal. The DPD system comprises a DPD actuator comprising one or more configurable multiplication functions, each configurable to operate in different power modes. The different power modes comprise a first power mode in which the configurable multiplication function multiplies a first value related to an input sample of the input signal and a second value related to a respective DPD value to provide an output value and a second power mode in which the configurable multiplication function outputs, as the output value, are an approximation of a multiplication of the first value and the second value. By having different power modes, the configurable multiplication functions can selectively be configured in either the first or second power modes to provide a low power DPD system.

In some embodiments, the input sample and the respective DPD value are complex values, the first value related to the input sample is either a real component or an imaginary component of the input sample, and the second value related to the DPD value is either a real component or an imaginary component of the DPD value. In some other embodiments, the input sample and the respective DPD value are complex values, the first value related to the input sample is either a sum of a real component and an imaginary component of the input sample or the real component of the input sample, and the second value related to the DPD value is either a real component of the DPD value, an imaginary component of the DPD value, or a sum of the real component and the imaginary component of the DPD value.

In some embodiments, the DPD actuator further comprises a controller that is operable to, for each input sample of a plurality of input samples of the input signal, configure each of the one or more configurable multiplication functions in one of the different power modes selected based on whether the second value related to a respective DPD value can be approximated as a power of 2 value. In some other embodiments, the DPD actuator further comprises a controller that is operable to, for each input sample of a plurality of input samples of the input signal, configure each of the one or more configurable multiplication functions in one of the different power modes selected based on whether the selected value related to a respective DPD value can be approximated as a combination of power of 2 values.

In some embodiments, each configurable multiplication function comprises multiplication circuitry operable to multiply a first value related to an input sample and a second value related a respective DPD value to provide an output value and shifting circuitry operable to process a first value related to an input sample to provide an approximation of a multiplication of the first value related to the input sample and a second value related to a respective DPD value based on one or more bit shifting operations. The controller is further operable to, for each input sample of the plurality of input samples of the input signal, for each configurable multiplication function: activate the multiplication circuitry and deactivate the shifting circuitry to configure the configurable multiplication function in the first power mode if the one of the different power modes to be used by the configurable multiplication function for the input sample is the first power mode; and deactivate the multiplication circuitry and activate the shifting circuitry to configure the configurable multiplication function in the second power mode if the one of the different power modes to be used by the configurable multiplication function for the input sample is the second power mode.

In some embodiments, the DPD actuator further comprises a Look-Up Table (LUT) comprising a plurality of LUT entries comprising a plurality of DPD values, respectively. For each LUT entry, the DPD actuator stores information that, for each configurable multiplication function, indicates one of the different power modes to be used by the configurable multiplication function when the LUT entry is selected for output by the LUT. The DPD actuator further comprises selection circuitry operable to, for each input sample of a plurality of input samples of the input signal, select a selected LUT entry from among the plurality of LUT entries based on a power of the input sample. The DPD actuator further comprises a controller that is operable to, for each input sample of the plurality of input samples of the input signal, for each configurable multiplication function: obtain the information that indicates the one of the different power modes to be used by the configurable multiplication function for the selected LUT entry; and configure the configurable multiplication function in the one of the different power modes to be used by the configurable multiplication function for the selected LUT entry.

In some embodiments, the DPD system further comprises an adaptation system comprising an adaptor operable to generate the plurality of DPD values for the plurality of LUT entries and store the plurality of DPD values in the plurality of LUT entries in the LUT. The adaptation system further comprises an approximation function. For each LUT entry, the adaptation system is operable to generate and store the information that indicates, for each configurable multiplication function, the one of the different power modes that is to be used by the configurable multiplication function when the LUT entry is selected for output by the LUT. In some embodiments, the adaptor comprises a modification function and a LUT value generation function operable to generate the plurality of DPD values for the plurality of LUT entries, wherein the modification function is operable to approximate each of at least some input values of the LUT value generation function as either a power of 2 value or a combination of two or more power of 2 values.

In some embodiments, each configurable multiplication function comprises multiplication circuitry operable to multiply a first value related to an input sample and a second value related to a respective DPD value to provide an output value and shifting circuitry operable to process a first value related to an input sample to provide an approximation of a multiplication of the first value related to the input sample and a second value related to a respective DPD value based on one or more bit shifting operations. For each input sample of the plurality of input samples of the input signal, the controller is further operable to, for each configurable multiplication function: activate the multiplication circuitry and deactivate the shifting circuitry to configure the configurable multiplication function in the first power mode if the one of the different power modes to be used by the configurable multiplication function for the selected LUT entry is the first power mode; and deactivate the multiplication circuitry and activate the shifting circuitry to configure the configurable multiplication function in the second power mode if the one of the different power modes to be used by the configurable multiplication function for the selected LUT entry is the second power mode.

In some embodiments, for each configurable multiplication function, the different power modes further comprise a third power mode in which a first value related to an input sample is provided as an output value such that the configurable multiplication function is bypassed, and the configurable multiplication function further comprises bypass circuitry operable to provide a first value related to an input sample provided as an input to the configurable multiplication function as an output value of the configurable multiplication function. Further, for each input sample of the plurality of input samples of the input signal, the controller is further operable to, for each configurable multiplication function: activate the multiplication circuitry, deactivate the shifting circuitry, and deactivate the bypass circuitry to configure the configurable multiplication function in the first power mode if the one of the different power modes to be used by the configurable multiplication function for the selected LUT entry is the first power mode; deactivate the multiplication circuitry, activate the shifting circuitry, and deactivate the bypass circuitry to configure the configurable multiplication function in the second power mode if the one of the different power modes to be used by the configurable multiplication function for the selected LUT entry is the second power mode; and deactivate the multiplication circuitry, deactivate the shifting circuitry, and activate the bypass circuitry to configure the configurable multiplication function in the third power mode if the one of the different power modes to be used by the configurable multiplication function for the selected LUT entry is the third power mode.

In some embodiments, the different power modes further comprise a third power mode in which a first value related to an input sample that is provided as an input to the configurable multiplication function is provided as an output value of the configurable multiplication function.

In some embodiments, the DPD actuator is further operable to configure one of the one or more configurable multiplication functions in the first power mode when processing a first input sample of the input signal and reconfiguring the one of the one or more configurable multiplication functions in the second power mode when processing a second input sample of the input signal.

Embodiments of a method of digitally predistorting an input signal to provide an output signal are also disclosed. In some embodiments, the method comprises dynamically configuring each configurable multiplication function of one or more configurable multiplication functions in a DPD actuator of a DPD actuator to operate in different power modes. The different power modes comprise a first power mode in which the configurable multiplication function multiplies a first value related to an input sample of the input signal and second value related to a respective DPD value to provide an output value and a second power mode in which the configurable multiplication function outputs, as the output value, an approximation of a multiplication of the first value and the second value. The method further comprises digitally predistorting the input signal using the DPD actuator.

In some embodiments, the input sample and the respective DPD value are complex values, the first value related to the input sample is either a real component or an imaginary component of the input sample, and the second value related to the DPD value is either a real component or an imaginary component of the DPD value.

In some embodiments, the input sample and the respective DPD value are complex values, the first value related to the input sample is either a sum of a real component and an imaginary component of the input sample or the real component of the input sample, and the second value related to the DPD value is either a real component of the DPD value, an imaginary component of the DPD value, or a sum of the real component and the imaginary component of the DPD value.

In some embodiments, for each configurable multiplication function, dynamically configuring the configurable multiplication function comprises, for each input sample of a plurality of input samples of the input signal, configuring the configurable multiplication function in one of the different power modes selected based on whether the second value related to a respective DPD value can be approximated as a power of 2 value. In some other embodiments, for each configurable multiplication function, dynamically configuring the configurable multiplication function comprises, for each input sample of a plurality of input samples of the input signal, configuring the configurable multiplication function in one of the different power modes selected based on whether the second value related to a respective DPD value can be approximated as a combination of power of 2 values.

In some embodiments, the DPD actuator further comprises a LUT comprising a plurality of LUT entries comprising a plurality of DPD values, respectively. For each LUT entry, the DPD actuator stores information that, for each configurable multiplication function, indicates one of the different power modes to be used by the configurable multiplication function when the LUT entry is selected for output by the LUT. The method further comprises, for each input sample of a plurality of input samples of the input signal, selecting a selected LUT entry from among the plurality of LUT entries based on a power of the input sample. For each configurable multiplication function, dynamically configuring the configurable multiplication function comprises, for each input sample of a plurality of input samples of the input signal, obtaining the information that indicates the one of the different power modes to be used by the configurable multiplication function for the selected LUT entry and configuring the configurable multiplication function in the one of the different power modes to be used by the configurable multiplication function for the selected LUT entry.

In some embodiments, the method further comprises generating the plurality of DPD values for the plurality of LUT entries and storing the plurality of DPD values in the plurality of LUT entries in the LUT. The method further comprises, for each LUT entry of the plurality of LUT entries, generating and storing the information that indicates, for each configurable multiplication function, the one of the different power modes is to be used by the configurable multiplication function when the LUT entry is selected for output by the LUT. In some embodiments, generating the plurality of DPD values comprises approximating each of at least some input values used for generating the DPD values as either a power of 2 value or a combination of two or more power of 2 values.

In some embodiments, each configurable multiplication function comprises multiplication circuitry operable to multiply a first value related to an input sample and a second value related to a respective DPD value to provide an output value and shifting circuitry operable to process a first value related to an input sample to provide an approximation of a multiplication of the first value related to the input sample and a second value related to a respective DPD value based on one or more bit shifting operations. For each configurable multiplication function, dynamically configuring the configurable multiplication function comprises, for each input sample of a plurality of input samples of the input signal: activating the multiplication circuitry and deactivating the shifting circuitry to configure the configurable multiplication function in the first power mode if the one of the different power modes to be used by the configurable multiplication function for the selected LUT entry is the first power mode; and deactivating the multiplication circuitry and activating the shifting circuitry to configure the configurable multiplication function in the second power mode if the one of the different power modes to be used by the configurable multiplication function for the selected LUT entry is the second power mode.

In some embodiments, the different power modes further comprise a third power mode in which a first value related to an input sample provided as an input to the configurable multiplication function is provided as an output value of the configurable multiplication function.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Systems and methods are disclosed herein for reducing the computational complexity of Digital Predistortion (DPD). As a result, power consumption due to DPD is substantially reduced. In general, conventional multiplication circuitry utilized in a DPD actuator is replaced with configurable multiplication functions, each being configurable in two or more power modes. In a first power mode, a multiplication function is configured to multiply (e.g., using conventional multiplier circuits) an input value and a DPD value. In a second power mode, the multiplication function is configured to perform an approximation of a multiplication the input value and the DPD value, e.g. using one or more binary bit shift operations. In this manner, computational complexity, and thus power consumption, of the DPD actuator is reduced.

Figure 1:
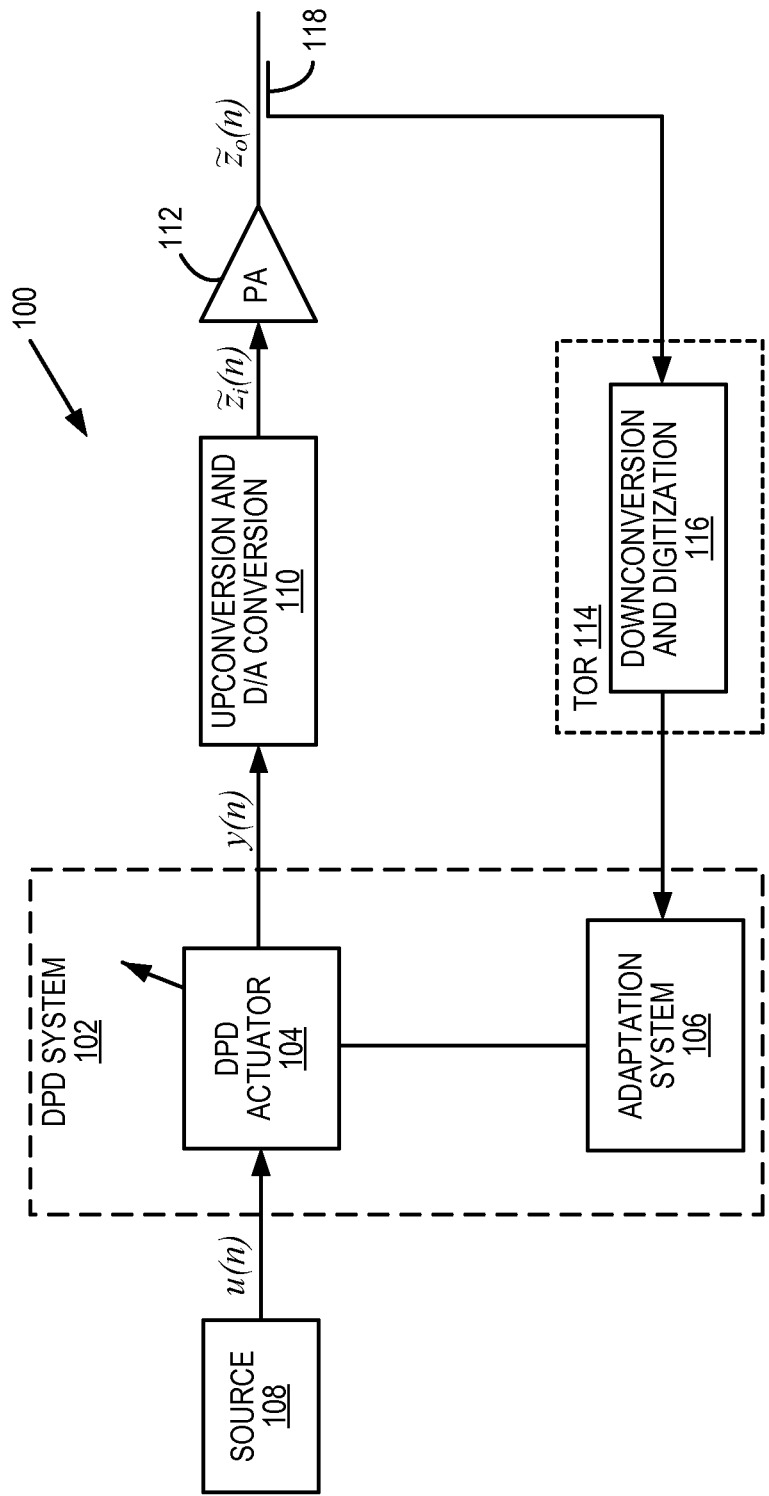
FIG. 1 illustrates one example of a transmitter that includes a Digital Predistortion (DPD) system in accordance with embodiments of the present disclosure.

In this regard, FIG. 1 illustrates one example of a transmitter 100 that includes a low power DPD system 102 in accordance with embodiments of the present disclosure. Note that the DPD system 102 and, in particular, the components of the DPD system 102 may be implemented in hardware or a combination of hardware and software. The DPD system 102 includes a DPD actuator 104 and an adaptation system 106. As illustrated, the transmitter 100 includes a source 108, the DPD actuator 104, upconversion and Digital-to-Analog (D/A) conversion circuitry 110, and a Power Amplifier (PA) 112. The upconversion and D/A conversion circuitry 110 and the PA 112 form a non-linear subsystem having a non-linear characteristic. The PA 112 is operated in a non-linear mode (i.e., at or near saturation) and, as such, the non-linear characteristic of the non-linear subsystem is more particularly a non-linear characteristic of the PA 112. The transmitter 110 also includes a feedback path including a transmit observation receiver 114 including downconversion and digitization circuitry 116 as well as the adaptation system 106. The downconversion and digitization circuitry 116 is coupled to an output of the PA 112 via a coupler 118.

In operation, the source 108 outputs a digital input signal u(n), which is a complex-valued baseband information bearing signal. The DPD actuator 104 is configured by the adaptation system 106 to apply a desired predistortion to the digital input signal u(n) to thereby provide a predistorted digital input signal y(n), which is also a complex valued signal. The desired predistortion is, or is approximately, an inverse of a distortion caused by the non-linear characteristic of the PA 112, which in turn effectively linearizes the PA 112. The predistorted digital input signal y(n) is upconverted to a desired carrier frequency and D/A converted by the upconversion and D/A conversion circuitry 110 to provide a radio frequency analog input signal $\tilde{z}_i(n)$ to the PA 112. Notably, the predistorted digital input signal y(n) may be upconverted and D/A converted by, for example, Digital Radio Frequency (DRF) upconversion followed by D/A conversion or D/A conversion followed by analog upconversion. The PA 112 amplifies the radio frequency analog input signal $\tilde{z}_i(n)$ to provide a radio frequency analog output signal $\tilde{z}_o(n)$.

In the feedback path, the downconversion and digitization circuitry 116 downconverts and digitizes the radio frequency analog output signal $\tilde{z}_o(n)$ to provide a digital feedback signal, which may in some example embodiments be at baseband. The adaptation system 106 utilizes a desired adaptation scheme to update, or dynamically configure, the DPD actuator 104. For the discussion herein, the DPD actuator 104 is a Look-Up Table (LUT) based DPD actuator having LUTs that store DPD values to be applied to the digital input signal u(n). When activated, the adaptation system 106 calculates the DPD values for the LUTs such that the DPD actuator 104 provides the desired digital predistortion.

It should be noted that the transmitter 100 of FIG. 1 is only an example. The DPD system 102 may be implemented in any transmitter in which DPD is desired.

Figure 2:
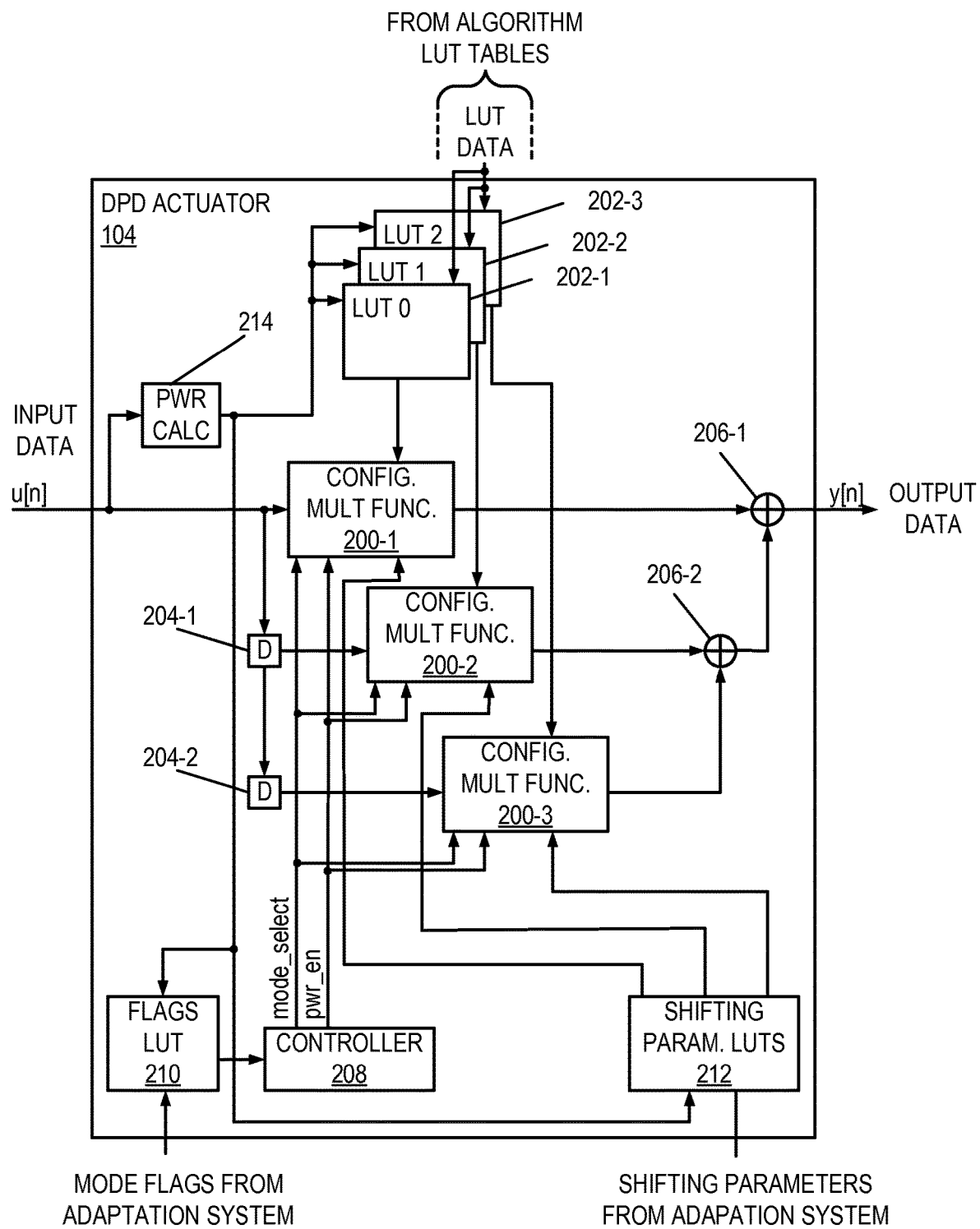
FIG. 2 illustrates an example embodiment of a DPD actuator of the DPD system of FIG. 1 in accordance with some embodiments of the present disclosure.

FIG. 2 illustrates an example embodiment of the DPD actuator 104 in accordance with some embodiments of the present disclosure. Importantly, FIG. 2 is provided for a scenario in which the digital input signal is a real signal (i.e., includes only a real component) and the DPD values are real values (i.e., include only real components). This is done for clarity and to assist in understanding. Embodiments for complex signals are discussed below.

Looking at FIG. 2, the DPD actuator 104 includes, in this example, three memory taps. Note that three memory taps are only an example. Any number of one or more memory taps may be used. The three memory taps of the DPD actuator 104 include configurable multiplication functions 200-1 through 200-3, respectively. The configurable multiplication functions 200-1 through 200-3 are generally referred to herein as configurable multiplication functions 200. The configurable multiplication function 200-1 receives input samples of the digital input signal and outputs output samples that at least approximate the product of the input samples and respective DPD values stored in a respective LUT 202-1 (also denoted as LUT 0). The configurable multiplication function 200-2 receives delayed input samples of the digital input signal from a delay 204-1 and outputs output samples that at least approximate the product of the delayed input samples and respective DPD values stored in a respective LUT 202-2 (also denoted as LUT 1). The configurable multiplication function 200-3 receives further delayed input samples of the digital input signal from a delay 204-2 and outputs output samples that at least approximate the product of the further delayed input samples and respective DPD values stored in a respective LUT 202-3 (also denoted as LUT 2). Corresponding output samples from the configurable multiplication functions 200-1 through 200-3 are added by adders 206-1 and 206-2 to provide output samples of the predistorted output signal.

As discussed herein, each of the configurable multiplication functions 200-1 through 200-3 is configurable (and reconfigurable) in one of two or more power modes. More specifically, each configurable multiplication function 200 can be configured in the following power modes:

Multiply Mode: A multiply mode (also referred to herein as a first power mode) in which the configurable multiplication function 200 uses multiplication circuitry (e.g., a conventional multiplier circuit). In this multiply mode, the multiplication circuitry is activated and circuitry utilized for the other power modes is optionally deactivated.

Approximation Mode: An approximation mode (also referred to herein as a second power mode) in which the configurable multiplication function 200 uses approximation circuitry that approximates multiplication, e.g., by using a single binary bit shift operation (e.g., an approximation of the DPD value as a power of two) or by using two or more bit shifting operations and combining the results via addition or subtraction (e.g., an approximation of the DPD value as a combination to two or more power of 2 values). In this approximation mode, the multiplication circuitry used for the multiply mode is deactivated, the approximation circuitry is activated, and optionally other circuitry used for power modes other than the multiply mode and the approximation mode is deactivated.

Bypass Mode (Optional): Optionally, a bypass mode (also referred to herein as a third power mode) in which the configurable multiplication function 200 bypasses the multiplication to thereby approximate the multiplication as a multiplication by 1. In this bypass mode, the multiplication circuitry used for the multiply mode is deactivated, the approximation circuitry used for the approximation mode is deactivated, bypass circuitry (e.g., a switch connecting the input of the configurable multiplication function 200 to the output of the configurable multiplication function 200) used for the bypass mode is activated (e.g., the switch is closed), and optionally other circuitry used for power modes other than the multiply mode, the approximation mode, and the bypass mode is deactivated.

Zero Output Mode (Optional): Optionally, a zero output mode (also referred to herein as a fourth power mode) in which the configurable multiplication function 200 outputs a value of 0 to thereby approximate the multiplication as a multiplication by 0. In this zero output mode, the multiplication circuitry used for the multiply mode is deactivated, the approximation circuitry used for the approximation mode is deactivated, the bypass circuitry used for the bypass mode is deactivated, circuitry (e.g., a buffer) that produces a value of zero at the output of the configurable multiplication function 200 is activated, and optionally other circuitry used for power modes other than the multiply mode, the approximation mode, and the bypass mode is deactivated.

In this embodiment, the DPD actuator 104 includes a controller 208 that controls the power modes of the configurable multiplication functions 200-1 through 200-3 as well as the activation and deactivation of the respective circuitry based on information that indicates the appropriate power mode for each DPD value in the LUTs 202-1 through 102-3. In this example, this information is stored as flags in a flags LUT 210. Note that while illustrated as being stored in the flags LUT 210, the flags can be stored anywhere in the DPD system 102. As an example, the flags may alternatively be stored in the corresponding LUT entries in the LUTs 202-1 through 202-3.

While the details of the adaptation system 106 are provided below, a brief overview of the adaptation system 106 will assist in understanding how the power modes of the configurable multiplication functions 200-1 through 200-3 are controlled by the controller 208. The LUTs 202-1 through 202-3 each include multiple LUT entries, one for each of a number of input power levels. In operation, the adaptation system 106 computes DPD values and stores those DPD values in the LUT entries within the LUTs 202-1 through 202-3. The details of the DPD values are not important, but in general the DPD values are optimized to provide the desired DPD. For each DPD value in each of the LUTs 202-1 through 202-3, the adaptation system 106 determines whether the DPD value can be approximated as:
- a power of 2 value or a combination of power of 2 values to some predefined or preconfigured degree of accuracy (e.g., a degree of accuracy needed to achieve a desired Adjacent Channel Leakage-Power Ratio (ACLR)),
- (optionally) a value of 1 to some predefined or preconfigured degree of accuracy (e.g., a degree of accuracy needed to achieve a desired ACLR), or
- (optionally) a value of 0 to some predefined or preconfigured degree of accuracy (e.g., a degree of accuracy needed to achieve a desired ACLR) as a value of 0.

Based on this determination, for each LUT entry in each of the LUTs 202, the adaptation system 106 stores a respective flag in the flags LUT 210 that indicates the power mode to be used by the respective configurable multiplication function 200 when the DPD value in that LUT entry is selected for output by the LUT 202. For example, if the DPD value to be stored in a particular LUT entry of the LUT 202-1 can be approximated as a power of 2 value or as a combination of two or more power of 2 values, the flag for that LUT entry of the LUT 202-1 is set to a value that indicates that the approximation mode is to be used by the configurable multiplication function 200-1 when that LUT entry is selected for output by the LUT 202-1. Conversely, if the DPD value to be stored in the particular LUT entry of the LUT 202-1 cannot be approximated as a power of 2 value or as a combination of two or more power of 2 values (and optionally also cannot be approximated as a value of 1 or as a value of 0), the flag for that LUT entry of the LUT 202-1 is set to a value that indicates that the multiply mode is to be used by the configurable multiplication function 200-1 when that LUT entry is selected for output by the LUT 202-1.

As discussed below, shifting parameter LUTs 212 store values for one or more parameters utilized to approximate multiplication using binary bit shifting operation(s). In this example, the shifting parameter LUTs 212 include a separate LUT for each of the memory taps. Each entry of each of the shifting parameter LUTs 212 stores values for one or more parameters used by the respective configurable multiplication function 200 to approximate multiplication when a respective LUT entry of a respective LUT 202 is selected for output by that LUT 202.

In operation, for each input sample of the digital input signal, a power calculator 214 computes a power level of the input sample output by a corresponding index for the LUTs 202-1 through 202-3. As a result, the DPD values stored in the indexed LUT entries of the LUTs 202-1 through 202-3 are output by the LUTs 202-1 through 202-3. The index output by the power calculator 214 is also input to the flags LUT 210 and the shifting parameter LUTs 212. The flags LUT 210 outputs the flags that indicate the power modes to be used by the configurable multiplication functions 200-1 through 200-3 (i.e., the power modes that were determined as the power modes to be used when the corresponding LUT entries are selected for output by the LUTs 202-1 through 202-3). Based on the flags output by the flags LUT 210, the controller 208 configures the configurable multiplication functions 200-1 through 200-3 to operate in the indicated power modes. This includes activating and deactivating the appropriate circuitry in the configurable multiplication functions 200-1 through 200-3. In addition, the shifting parameter LUTs 212 output the values needed by the configurable multiplication functions 200-1 through 200-3 in the event that the configurable multiplication functions 200-1 through 200-3 are configured in the approximation mode.

Once configured, the configurable multiplication function 200-1 outputs a product of, or an approximation of the product of, the input sample and the DPD value stored in the indexed LUT entry of the LUT 202-1; the configurable multiplication function 200-2 outputs a product of, or an approximation of the product of, the input sample output by the delay 204-1 and the DPD value stored in the indexed LUT entry of the LUT 202-2; and the configurable multiplication function 200-3 outputs a product of, or an approximation of the product of, the input sample output by the delay 204-2 and the DPD value stored in the indexed LUT entry of the LUT 202-3. The outputs of the configurable multiplication functions 200-1 through 200-3 are added by the adders 206-1 and 206-2 to provide an output sample of the predistorted signal output by the DPD actuator 104. This process is then repeated for the next input sample. Thus, the configurable multiplication functions 200-1 through 200-3 are reconfigured for each input sample and, as such, the power modes of the configurable multiplication functions 200-1 through 200-3 can be changed from one input sample to another, as determined by the controller 208.

Figure 3:
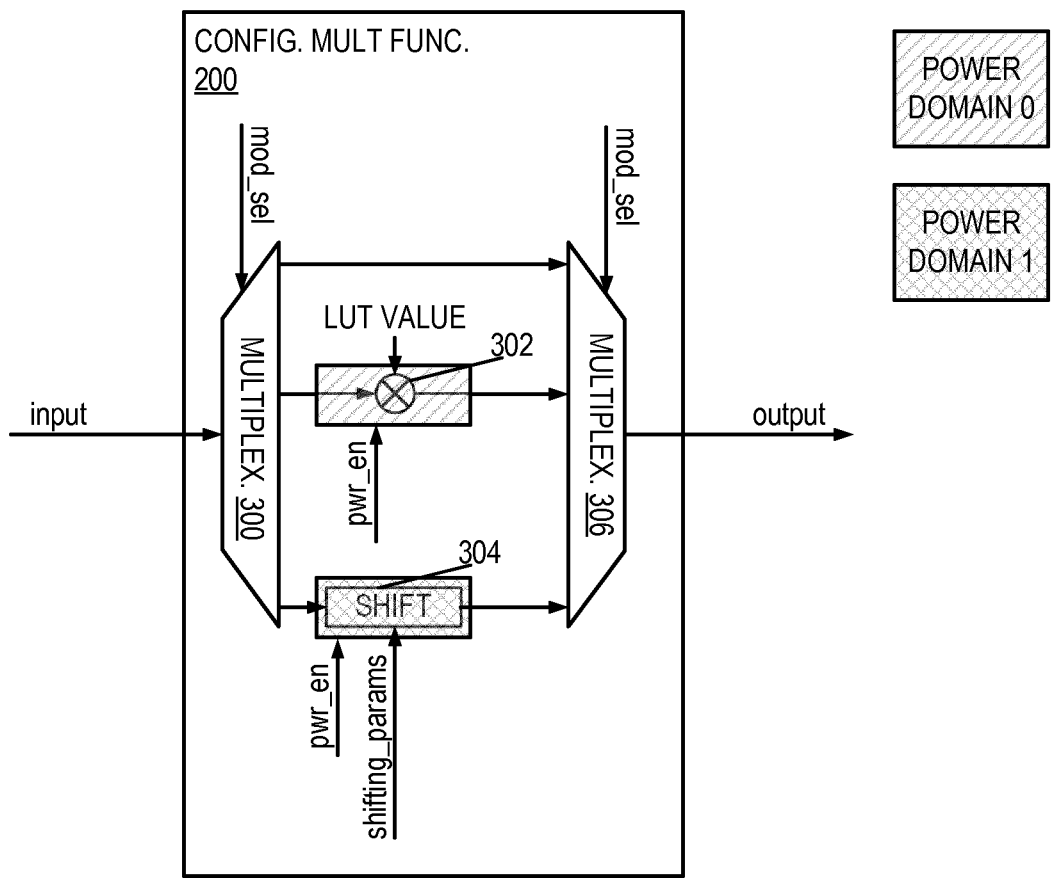
FIG. 3 illustrates one example of a configurable multiplication function of the DPD actuator of FIG. 2 in accordance with some embodiments of the present disclosure.

FIG. 3 illustrates one example of the configurable multiplication function 200. In this example, the configurable multiplication function 200 includes an input multiplexer 300, a multiplier circuit 302, a shifting function 304, and an output multiplexer 306. In this example, the configurable multiplication function 200 can be configured in either the multiply mode, the approximation mode, or the bypass mode, as controlled by the controller 208 using a mode select signal (mod_sel) and a power enable signal (pwr_en).

When configured for the multiply mode, the mod_sel signal is set to a value that causes the input multiplexer 300 to output the input signal to the multiplier circuit 302 and causes the output multiplexer 306 to output the output of the multiplier circuit 302. In addition, the pwr_en signal is provided such that a power domain (power domain 0) in which the multiplier circuit 302 is located is activated and a power domain (power domain 1) in which the shifting function 304 is located is deactivated.

When configured for the approximate mode, the mod_sel signal is set to a value that causes the input multiplexer 300 to output the input signal to the shifting function 304 and causes the output multiplexer 306 to output the output of the shifting function 304. In addition, the pwr_en signal is provided such that a power domain (power domain 0) in which the multiplier circuit 302 is located is deactivated and a power domain (power domain 1) in which the shifting function 304 is located is activated.

The shifting function 304 utilizes the respective shifting parameters provided by the shifting parameter LUT 212 to approximate multiplication of the input sample and the respective DPD value using one or more binary shifting operations. More specifically, in some embodiments, the shifting function 304 is a single binary bit shifter that shifts the bits of the input sample by a number of bit positions indicated by the shifting parameter(s). In some other embodiments, the DPD value is approximated as a combination of k power of 2 values as follows:

$$DPD\_value \approx s_1 \cdot 2^{p_1} + s_2 \cdot 2^{p_2} + \ldots + s_k \cdot 2^{p_k}$$

where $\{p_1, p_2, \ldots, p_k\}$ is a first set of values (referred to herein as power values), $\{s_1, s_2, \ldots, s_k\}$ is a second set of values (referred to herein as sign values), and each value $s_i \in \{+1, -1\}$ for all $i=1, 2, \ldots, k$. In this case, the shifting function 304 includes, e.g., a bit shifter and accumulation circuitry configured to perform k bit shift operations on the input sample in accordance with the first set of values $\{p_1, p_2, \ldots, p_k\}$ (i.e., shift the input sample by $p_1$ bit positions to provide a first bit-shifted value, shift the input sample by $p_2$ bit positions to provide a second bit-shifted value, ..., and shift the input sample by $p_k$ bit positions to provide a k-th bit-shifted value) and combine (i.e., add or subtract) the k bit-shifted values in accordance with the set of sign values $\{s_1, s_2, \ldots, s_k\}$.

When configured for the bypass mode, the mod_sel signal is set to a value that causes the input multiplexer 300 to output the input signal to the output multiplexer 306 and causes the output multiplexer 306 to output the input signal output of the input multiplexer 300. In addition, the pwr_en signal is provided such that a power domain (power domain 0) in which the multiplier circuit 302 is located is deactivated and a power domain (power domain 1) in which the shifting function 304 is located is deactivated.

As noted above, FIG. 2 illustrates an example of the DPD actuator 104 in which the input signal (and the DPD values) are real values. However, in real world implementations, the input signal and the DPD values are complex (i.e., contain both real and imaginary components). In this regard, FIG. 4 illustrates the DPD actuator 104 in accordance with one example embodiment in which the input signal and the DPD values are complex.

Figure 4:
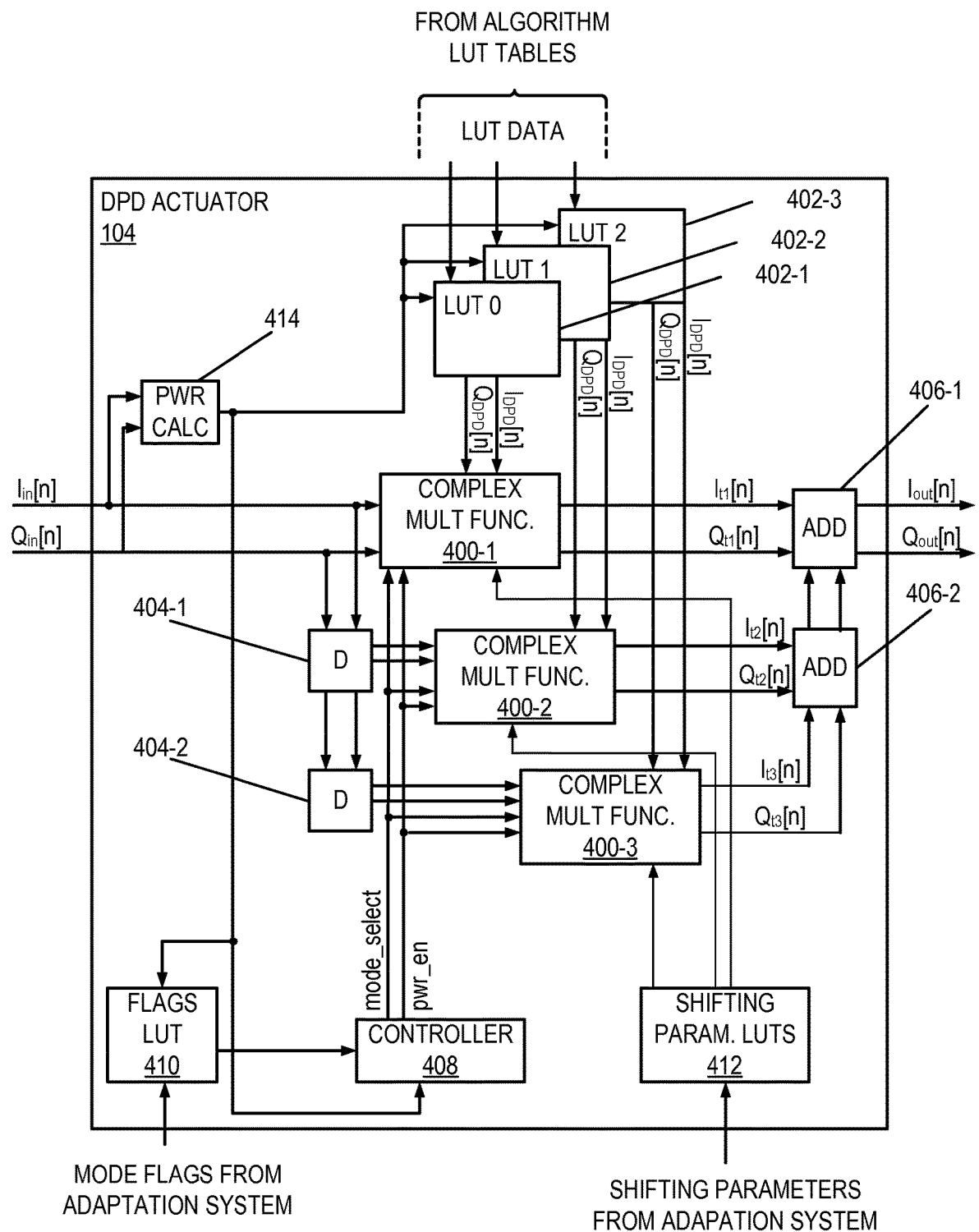
FIG. 4 illustrates another example of the DPD actuator in accordance with one example embodiment in which an input signal and DPD values are complex.

Looking at FIG. 4, the DPD actuator 104 includes, in this example, three memory taps. Note that three memory taps are only an example. Any number of one or more memory taps may be used. The three memory taps of the DPD actuator 104 include (configurable) complex multiplication functions 400-1 through 400-3, respectively. The complex multiplication functions 400-1 through 400-3 are generally referred to herein as complex multiplication functions 400. The complex multiplication function 400-1 receives complex input samples of the digital input signal and outputs complex output samples that at least approximate the product of the complex input samples and respective complex DPD values stored in a respective LUT 402-1 (also denoted as LUT 0). The complex multiplication function 400-2 receives delayed complex input samples of the complex digital input signal from a delay 404-1 and outputs complex output samples that at least approximate the product of the delayed complex input samples and respective complex DPD values stored in a respective LUT 402-2 (also denoted as LUT 1). The complex multiplication function 400-3 receives further delayed complex input samples of the complex digital input signal from a delay 404-2 and outputs complex output samples that at least approximate the product of the further delayed complex input samples and respective complex DPD values stored in a respective LUT 402-3 (also denoted as LUT 2). Corresponding complex output samples from the complex multiplication functions 400-1 through 400-3 are added by adders 406-1 and 406-2 to provide output samples of the predistorted output signal.

Figure 5:
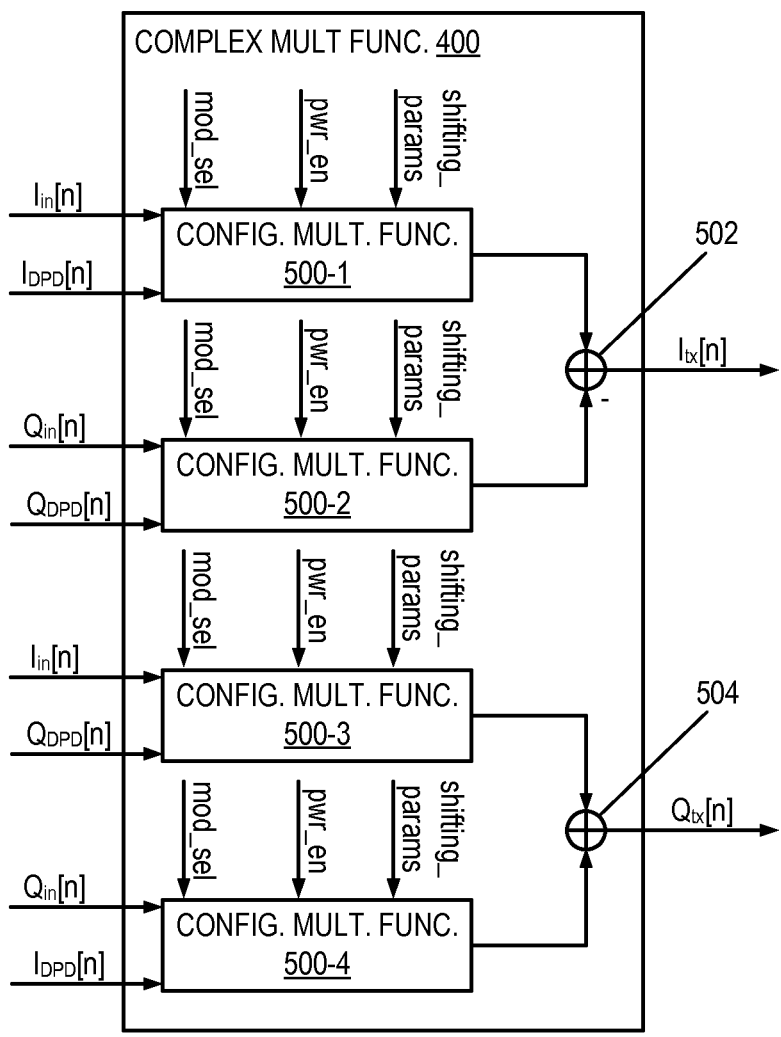
FIG. 5 illustrates one example of a complex multiplication function of the DPD actuator of FIG. 4 in which the complex multiplication function includes multiple configurable multiplication functions in accordance with some embodiments of the present disclosure.
Figure 6:
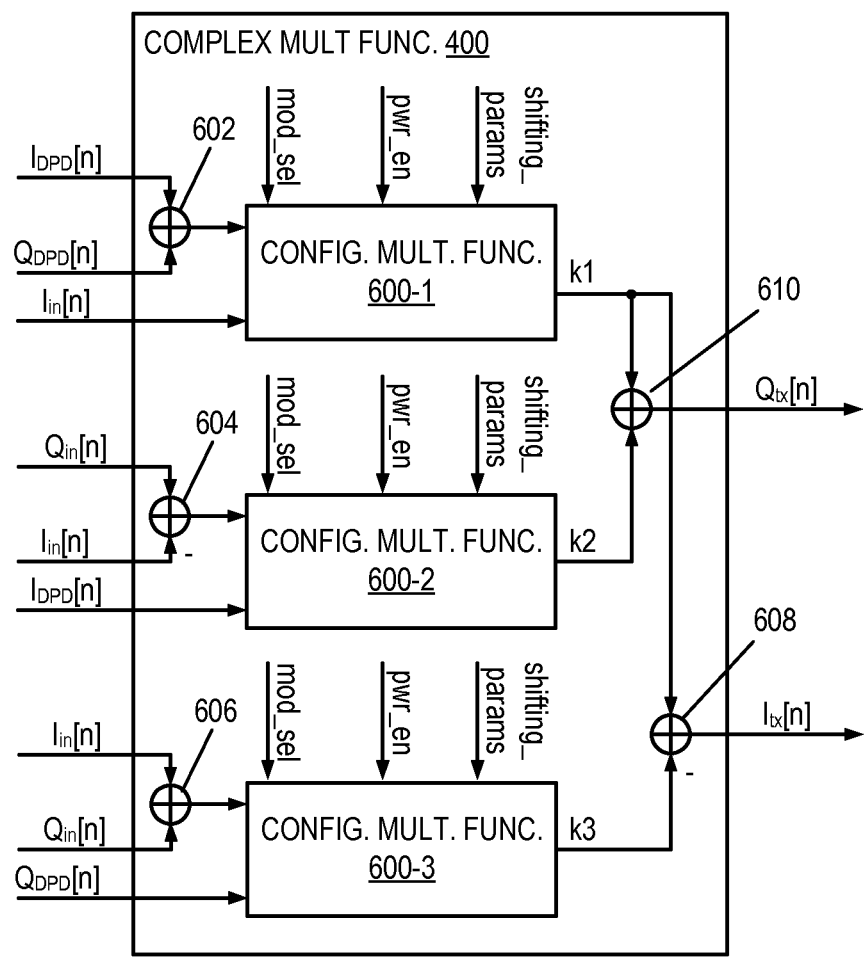
FIG. 6 illustrates another example of the complex multiplication function of the DPD actuator of FIG. 4 in which the complex multiplication function includes multiple configurable multiplication functions in accordance with some embodiments of the present disclosure.

Each of the complex multiplication functions 400-1 through 400-3 includes multiple configurable multiplication functions 500/600, as illustrated in the example embodiments of FIGS. 5 and 6. Note that the details of the configurable multiplication functions 500/600 are, in some embodiments, the same as those of the configurable multiplication functions 400 illustrated in FIG. 4.

Specifically, the multiplication of a complex input sample $(I_{in}, Q_{in})$ and a respective complex DPD value $(I_{DPD}, Q_{DPD})$ for a particular memory tap (tx) can be expressed as:

$$(I_{in}+iQ_{in}) \cdot (I_{DPD}+iQ_{DPD}) = Q_{in}Q_{DPD}+iI_{in}Q_{DPD}+ iI_{DPD}Q_{in}.$$

Thus, in some embodiments, each complex multiplication function 400 is implemented by four configurable multiplication functions 500-1 through 500-4, a subtractor 502, and an adder 504, as illustrated in FIG. 5. The configurable multiplication function 500-1 computes the term $I_{in}I_{DPD}$, the configurable multiplication function 500-2 computes the term $Q_{in}Q_{DPD}$, and the subtractor 502 subtracts the term $Q_{in}Q_{DPD}$ from the term $I_{in}I_{DPD}$ to thereby provide the real component $I_{tx}$ of the complex multiplication function 400. The configurable multiplication function 500-3 computes the term $I_{in}Q_{DPD}$, the configurable multiplication function 500-4 computes the term $Q_{in}I_{DPD}$, and the adder 504 adds the term $I_{in}Q_{DPD}$ and the term $Q_{in}I_{DPD}$ to thereby provide the imaginary component $Q_{tx}$ of the complex multiplication function 400.

As discussed herein, each of the configurable multiplication functions 500-1 through 500-4 is configurable (and reconfigurable) in one of two or more power modes. More specifically, as discussed above each configurable multiplication function 500 can be configured in the following power modes:

Multiply Mode: A multiply mode (also referred to herein as a first power mode) in which the configurable multiplication function 500 uses multiplication circuitry (e.g., a conventional multiplier circuit). In this multiply mode, the multiplication circuitry is activated and circuitry utilized for the other power modes is optionally deactivated.

Approximation Mode: An approximation mode (also referred to herein as a second power mode) in which the configurable multiplication function 500 uses approximation circuitry that approximates multiplication e.g., by using a single binary bit shift operation (e.g., an approximation of the DPD value as a power of two) or by using two or more bit shifting operations and combining the results via addition or subtraction (e.g., an approximation of the respective component of the complex DPD value as a combination to two or more power of 2 values). In this approximation mode, the multiplication circuitry used for the multiply mode is deactivated, the approximation circuitry is activated, and optionally other circuitry used for power modes other than the multiply mode and the approximation mode is deactivated.

Bypass Mode (Optional): Optionally, a bypass mode (also referred to herein as a third power mode) in which the configurable multiplication function 500 bypasses the multiplication to thereby approximate the multiplication as a multiplication by 1. In this bypass mode, the multiplication circuitry used for the multiply mode is deactivated, the approximation circuitry used for the approximation mode is deactivated, bypass circuitry (e.g., a switch connecting the input of the configurable multiplication function 500 to the output of the configurable multiplication function 500) used for the bypass mode is activated (e.g., the switch is closed), and optionally other circuitry used for power modes other than the multiply mode, the approximation mode, and the bypass mode is deactivated.

Zero Output Mode (Optional): Optionally, a zero output mode (also referred to herein as a fourth power mode) in which the configurable multiplication function 500 outputs a value of 0 to thereby approximate the multiplication as a multiplication by 0. In this zero output mode, the multiplication circuitry used for the multiply mode is deactivated, the approximation circuitry used for the approximation mode is deactivated, the bypass circuitry used for the bypass mode is deactivated, circuitry (e.g., a buffer) that produces a value of zero at the output of the configurable multiplication function 500 is activated, and optionally other circuitry used for power modes other than the multiply mode, the approximation mode, and the bypass mode is deactivated.

In some other embodiments, the multiplication of a complex input sample $(I_{in}, Q_{in})$ and a respective complex DPD value $(I_{DPD}, Q_{DPD})$ for a particular memory tap (tx) can be expressed as follows:

$$(I_{DPD}+iQ_{DPD}) \cdot (I_{in}+iQ_{in}),$$

$$k1 = I_{in}(I_{DPD}+Q_{DPD})$$

$$k2 = I_{DPD}(Q_{in}-I_{in})$$

$$k3 = Q_{DPD}(I_{in}+Q_{in})$$

$$I_{tx} = k1-k3$$

$$Q_{tx} = k1+k2$$

Thus, in some embodiments, each complex multiplication function 400 is implemented by three configurable multiplication functions 600-1 through 600-3, an adder 602, a subtractor 604, an adder 606, a subtractor 608, and an adder 610, as illustrated in FIG. 6. The configurable multiplication function 600-1 and the adder 602 operate to generate the term k1. The configurable multiplication function 600-2 and the subtractor 604 operate to generate the term k2. The configurable multiplication function 600-3 and the adder 606 operate to generate the term k3. The subtractor 608 then subtracts the term k3 from the term k1 to thereby provide the real component $I_{tx}$ of the complex multiplication function 400. The adder 610 adds the terms k1 and k2 to thereby provide the imaginary component $Q_{tx}$ of the complex output of the complex multiplication function 400.

Note that the example algorithm above for computing the complex multiplication is only an example. For instance, as another example, the multiplication of a complex input sample $(I_{in}, Q_{in})$ and a respective complex DPD value $(I_{DPD}, Q_{DPD})$ for a particular memory tap (tx) can be expressed as follows:

$$I_{in}+iQ_{in}) \cdot (I_{DPD}+iQ_{DPD})$$

$$k1 = I_{DPD}(I_{in}+Q_{in})$$

$$k2 = I_{in}(Q_{DPD}-I_{DPD})$$

$$k3 = Q_{in}(I_{DPD}+Q_{DPD})$$

$$I_{tx} = k1-k3$$

$$Q_{tx} = k1+k2$$

In this case, the inputs provided to the configurable multiplication functions 600-1 through 600-3, the adder 602, the subtractor 604, and the adder 606 would be changed in accordance with the equations above to implement the complex multiplication. Again, the examples above are only examples. Other techniques for multiplying two complex numbers may be used.

As discussed herein, each of the configurable multiplication functions 600-1 through 600-3 is configurable (and reconfigurable) in one of two or more power modes. More specifically, as discussed above each configurable multiplication function 600 can be configured in the following power modes:

Multiply Mode: A multiply mode (also referred to herein as a first power mode) in which the configurable multiplication function 600 uses multiplication circuitry (e.g., a conventional multiplier circuit). In this multiply mode, the multiplication circuitry is activated and circuitry utilized for the other power modes is optionally deactivated.

Approximation Mode: An approximation mode (also referred to herein as a second power mode) in which the configurable multiplication function 600 uses approximation circuitry that approximates multiplication, e.g., by using a single binary bit shift operation or by using two or more bit shifting operations and combining the results via addition or subtraction. In this approximation mode, the multiplication circuitry used for the multiply mode is deactivated, the approximation circuitry is activated, and optionally other circuitry used for power modes other than the multiply mode and the approximation mode is deactivated.

Bypass Mode (Optional): Optionally, a bypass mode (also referred to herein as a third power mode) in which the configurable multiplication function 600 bypasses the multiplication to thereby approximate the multiplication as a multiplication by 1. In this bypass mode, the multiplication circuitry used for the multiply mode is deactivated, the approximation circuitry used for the approximation mode is deactivated, bypass circuitry (e.g., a switch connecting the input of the configurable multiplication function 600 to the output of the configurable multiplication function 600) used for the bypass mode is activated (e.g., the switch is closed), and optionally other circuitry used for power modes other than the multiply mode, the approximation mode, and the bypass mode is deactivated.

Zero Output Mode (Optional): Optionally, a zero output mode (also referred to herein as a fourth power mode) in which the configurable multiplication function 600 outputs a value of 0 to thereby approximate the multiplication as a multiplication by 0. In this zero output mode, the multiplication circuitry used for the multiply mode is deactivated, the approximation circuitry used for the approximation mode is deactivated, the bypass circuitry used for the bypass mode is deactivated, circuitry (e.g., a buffer) that produces a value of zero at the output of the configurable multiplication function 600 is activated, and optionally other circuitry used for power modes other than the multiply mode, the approximation mode, and the bypass mode is deactivated.

Now returning to FIG. 4, in this embodiment, the DPD actuator 104 includes a controller 408 that controls the power modes of the configurable multiplication functions 500/600 of the complex multiplication functions 400-1 through 400-3 as well as the activation and deactivation of the respective circuitry based on information that indicates the appropriate power modes for the complex multiplication function 500/600 for each complex DPD value in the LUTs 402-1 through 402-3. In this example, this information is stored as flags in a flags LUT 410. Note that while illustrated as being stored in the flags LUT 410, the flags can be stored anywhere in the DPD system 102. As an example, the flags may alternatively be stored in the corresponding LUT entries in the LUTs 402-1 through 402-3.

While the details of the adaptation system 106 are provided below, a brief overview of the adaptation system 106 will assist in understanding how the power modes of the configurable multiplication functions 500/600 of the complex multiplication functions 400-1 through 400-3 are controlled by the controller 408. The LUTs 402-1 through 402-3 each include multiple LUT entries, one for each of a number of input power levels. In operation, the adaptation system 106 computes, in these embodiments, complex DPD values and stores those complex DPD values in the LUT entries within the LUTs 402-1 through 402-3. The details of the complex DPD values are not important, but in general the complex DPD values are optimized to provide the desired DPD.

Using the example embodiment of the complex multiplication function 400 illustrated in FIG. 5 as an example, in some embodiments, for each complex DPD value in each of the LUTs 402-1 through 402-3, the adaptation system 106 (in particular the approximation function 702) determines whether each component (i.e., the real component $I_{DPD}$ and the imaginary component $Q_{DPD}$) of the DPD value can be approximated as:

a power of 2 value or a combination of power of 2 values to some predefined or preconfigured degree of accuracy (e.g., a degree of accuracy needed to achieve a desired ACLR), (optionally) as a value of 1 to some predefined or preconfigured degree of accuracy (e.g., a degree of accuracy needed to achieve a desired ACLR), or (optionally) as a value of 0 to some predefined or preconfigured degree of accuracy (e.g., a degree of accuracy needed to achieve a desired ACLR) as a value of 0.

Based on this determination, in some embodiments, for each LUT entry in each of the LUTs 402, the adaptation system 106 stores:

a first flag in the flags LUT 410 that indicates the power mode to be used by the respective configurable multiplication function 500 used for multiplication of the real or imaginary component of the complex input sample by the real component $I_{DPD}$ of the complex DPD value in that LUT entry is selected for output by the LUT 402; and a second flag in the flags LUT 410 that indicates the power mode to be used by the respective configurable multiplication function 500 used for multiplication of the real or imaginary component of the complex input sample by the imaginary component $Q_{DPD}$ of the complex DPD value in that LUT entry is selected for output by the LUT 402.

For example, looking at the complex multiplication function 400 of FIG. 5, for each LUT entry in the respective LUT 402, the flags LUT 410 stores a first flag that indicates the power mode to be used by the configurable multiplication functions 500-1 and 500-4 when generating at least an approximation of the multiplication of the real component $I_{in}$ and the imaginary component $Q_{in}$ of the input sample by the real component $I_{DPD}$ of the complex DPD value stored in that LUT entry. In addition, the flags LUT 410 stores a second flag that indicates the power mode to be used by the configurable multiplication functions 500-2 and 500-3 when generating at least an approximation of the multiplication of the imaginary component $Q_{in}$ and the real component $I_{in}$ of the input sample by the imaginary component $Q_{DPD}$ of the complex DPD value stored in that LUT entry.

In some other embodiments, the adaptation system 106 has knowledge of the architecture of the complex multiplication function 400. Using the example embodiment the complex multiplication function 400 illustrated in FIG. 6 as an example, the adaptation system 106 has knowledge that the complex multiplication function 400 uses three DPD related values as inputs to the three configurable multiplication functions 600-1 through 600-3, respectively. Namely, in this example, those three DPD related values are: (1) $I_{DPD}$, (2) $Q_{DPD}$, and (3) $I_{DPD}+Q_{DPD}$. However, the DPD related values will vary depending on the particular scheme used to perform the complex multiplication. For each LUT entry in each of the LUTs 402, for each of these DPD related values, the adaptation system 106 determines whether the DPD related value can be approximated as:

a power of 2 value or a combination of power of 2 values to some predefined or preconfigured degree of accuracy (e.g., a degree of accuracy needed to achieve a desired ACLR), (optionally) as a value of 1 to some predefined or preconfigured degree of accuracy (e.g., a degree of accuracy needed to achieve a desired ACLR), or (optionally) as a value of 0 to some predefined or preconfigured degree of accuracy (e.g., a degree of accuracy needed to achieve a desired ACLR) as a value of 0.

Based on this determination, in some embodiments, for each LUT entry in each of the LUTs 402, the adaptation system 106:

provides a first flag to the flags LUT 410 (where it is stored) that indicates the power mode to be used by the configurable multiplication function 600-1 when the complex DPD value in that LUT entry is selected for output by the LUT 402;

provides a second flag to the flags LUT 410 (where it is stored) that indicates the power mode to be used by the configurable multiplication function 600-2 when the complex DPD value in that LUT entry is selected for output by the LUT 402; and provides a third flag to the flags LUT 410 (where it is stored) that indicates the power mode to be used by the configurable multiplication function 600-3 when the complex DPD value in that LUT entry is selected for output by the LUT 402.

Looking again at FIG. 4, shifting parameter LUTs 412 store values for one or more parameters utilized by the configurable multiplication functions 500/600 to approximate multiplication using binary bit shifting operation(s). In this example, the shifting parameter LUTs 412 include a separate LUT for each of the memory taps. Each entry of each of the shifting parameter LUTs 412 stores, for both the real and imaginary components of the corresponding complex DPD value, values for one or more parameters used by the respective configurable multiplication function 400/500 to approximate multiplication when a respective LUT entry of a respective LUT 402 is selected for output by that LUT 402.

In operation, for each complex input sample of the digital input signal, a power calculator 414 computes a power level of the complex input sample and outputs a corresponding index for the LUTs 402-1 through 402-3. As a result, the complex DPD values stored in the indexed LUT entries of the LUTs 402-1 through 402-3 are output by the LUTs 402-1 through 402-3. The index output by the power calculator 414 is also input to the flags LUT 410 and the shifting parameter LUTs 412. The flags LUT 410 outputs the flags that indicate the power modes to be used by the configurable multiplication functions 500/600 of the complex multiplication functions 400-1 through 400-3. Based on the flags output by the flags LUT 410, the controller 408 configures the configurable multiplication functions 500/600 of the complex multiplication functions 400-1 through 400-3 to operate in the indicated power modes. This includes activating and deactivating the appropriate circuitry in the configurable multiplication functions 500/600. In addition, the shifting parameter LUTs 412 output the values needed by the configurable multiplication functions 500/600 in the event that the configurable multiplication functions 400-1 through 400-3 are configured in the approximation mode.

Once configured, the complex multiplication function 400-1 outputs a product of, or an approximation of the product of, the input sample and the complex DPD value stored in the indexed LUT entry of the LUT 402-1; the complex multiplication function 400-2 outputs a product of, or an approximation of the product of, the input sample output by the delay 404-1 and the complex DPD value stored in the indexed LUT entry of the LUT 402-2; and the complex multiplication function 800-3 outputs a product of, or an approximation of the product of, the input sample output by the delay 404-2 and the complex DPD value stored in the indexed LUT entry of the LUT 402-3. The outputs of the complex multiplication functions 400-1 through 400-3 are added by the adders 406-1 and 406-2 to provide a complex output sample of the predistorted signal output by the DPD actuator 104. This process is then repeated for the next input sample. Thus, the configurable multiplication functions 500/600 of the complex multiplication functions 400-1 through 400-3 are reconfigured for each input sample and, as such, the power modes of the configurable multiplication functions 500/600 can be changed from one input sample to another, as determined by the controller 408.

Figure 7:
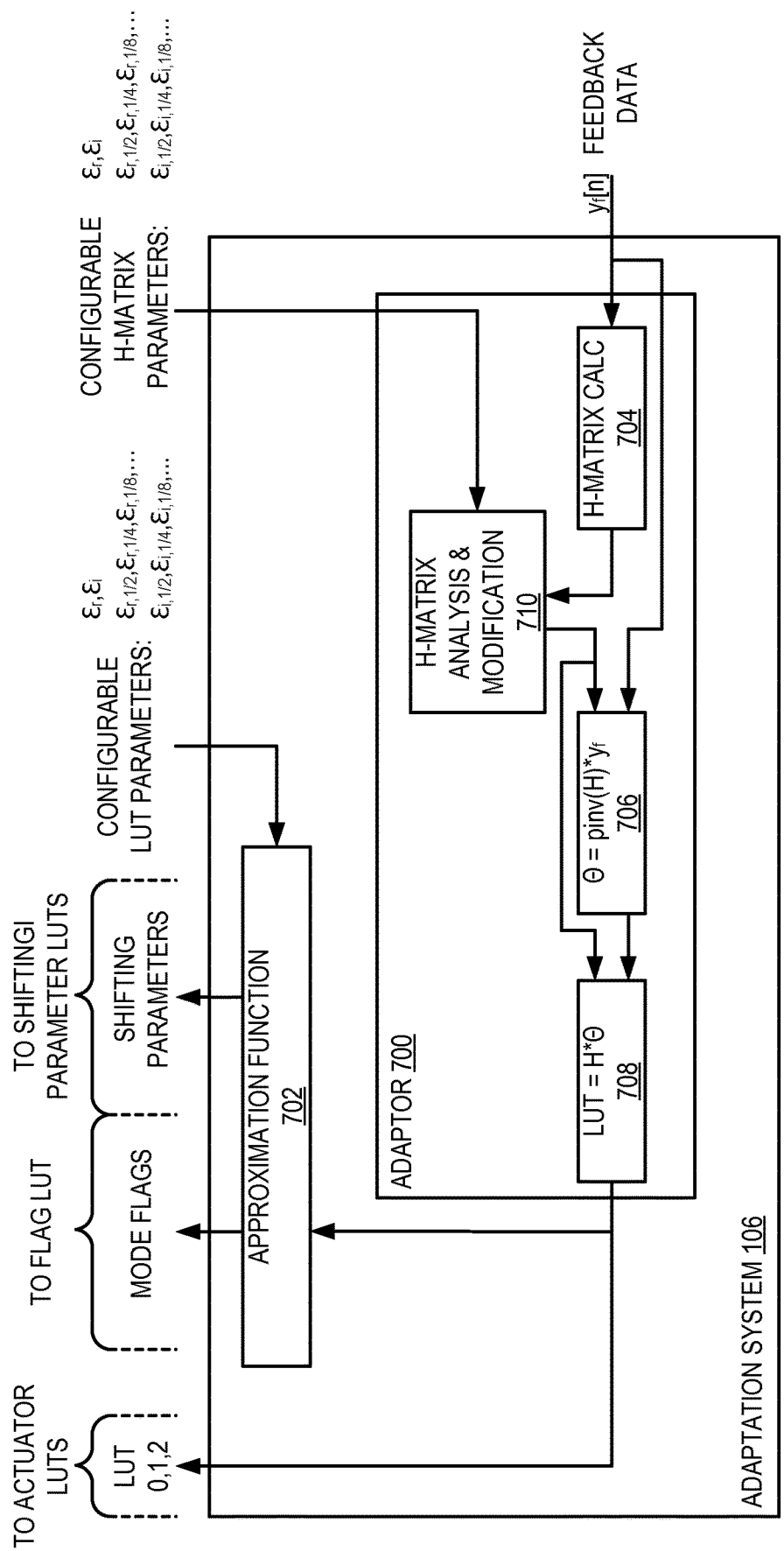
FIG. 7 illustrates one example of an adaptation system of the DPD system of FIG. 1 in accordance with some embodiments of the present disclosure.

FIG. 7 illustrates one example of the adaptation system 106. As illustrated, the adaptation system 106 includes an adaptor 700 and an approximation function 702. In this example, the adaptor 700 operates to generate the complex DPD values for the LUTs 802-1 through 802-3 based on some optimization algorithm, as will be understood by those of skill in the art of LUT-based DPD systems. In some embodiments (e.g., embodiments in which the complex multiplication function 400 of FIG. 5 are used), the approximation function 702 operates to determine whether each component (i.e., real and imaginary) of each complex DPD value can be approximated as:

a power of 2 value or a combination of power of 2 values to some predefined or preconfigured degree of accuracy (e.g., a degree of accuracy needed to achieve a desired ACLR), (optionally) as a value of 1 to some predefined or preconfigured degree of accuracy (e.g., a degree of accuracy needed to achieve a desired ACLR), or (optionally) as a value of 0 to some predefined or preconfigured degree of accuracy (e.g., a degree of accuracy needed to achieve a desired ACLR) as a value of 0.

Figure 8:
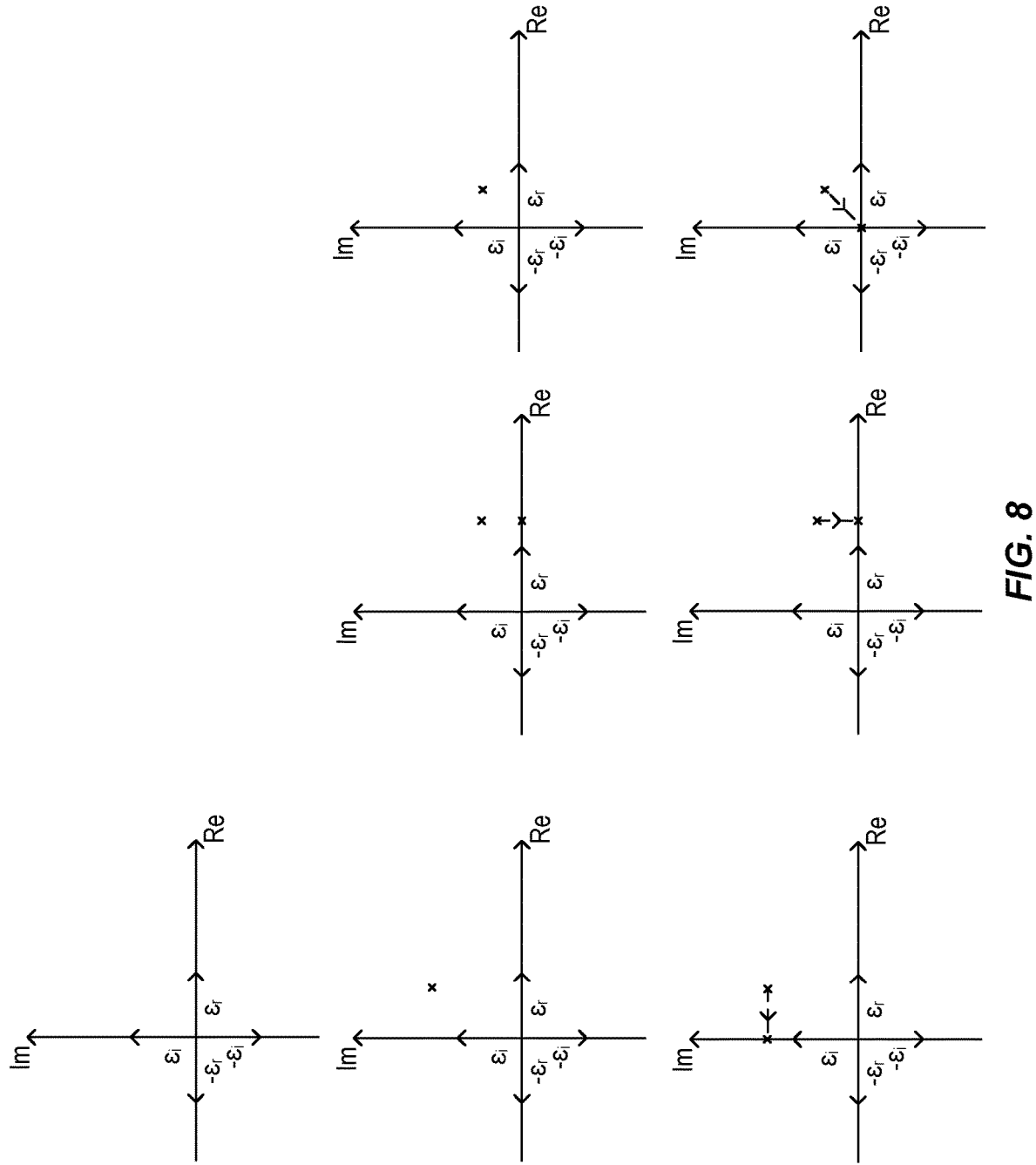
FIG. 8 illustrates several examples of an approximation of real and/or imaginary components of a complex value.
Figure 9:
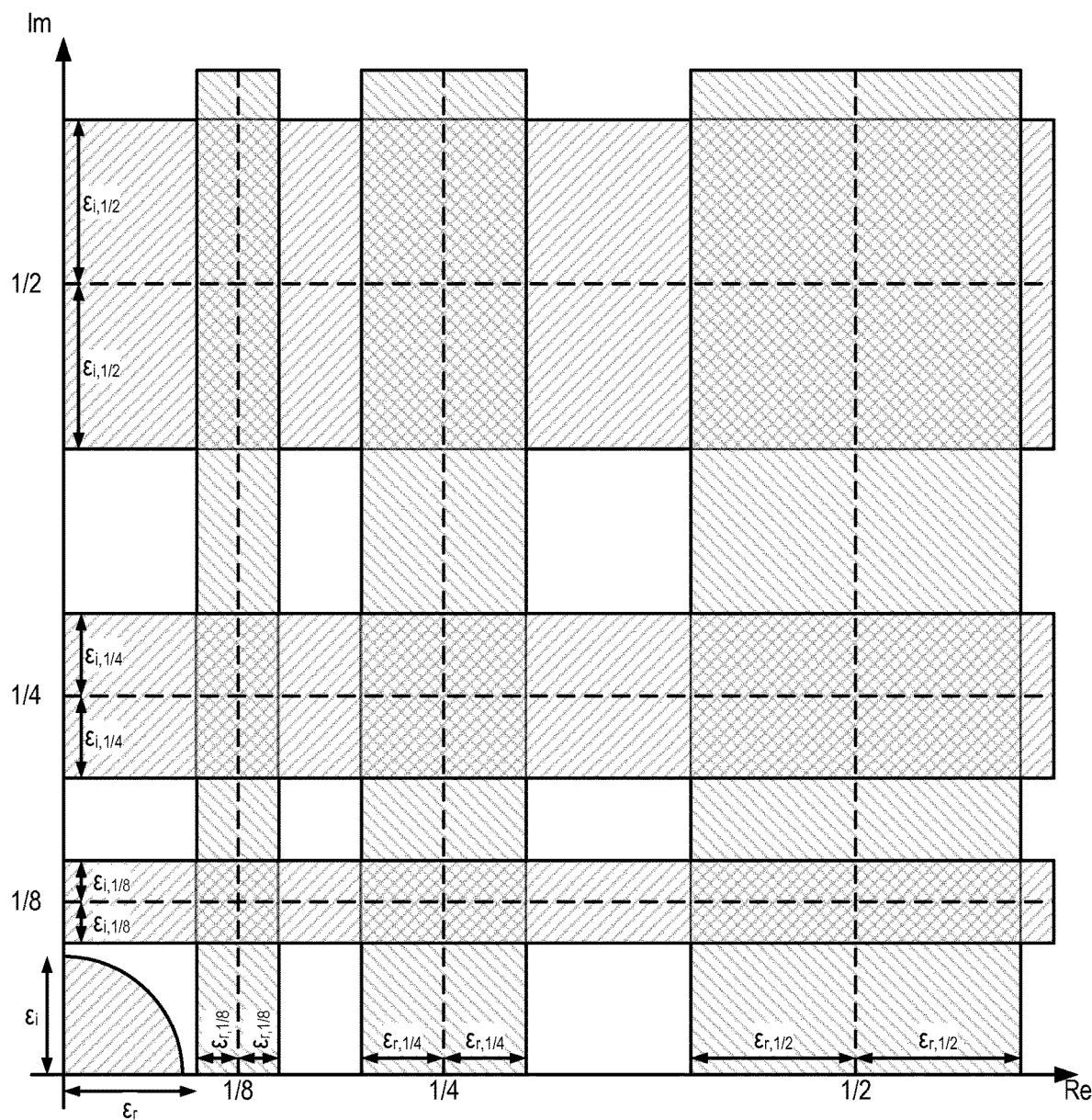
FIG. 9 is a visual representation of value ranges defined by a number of configurable parameters used to approximate the real and/or imaginary components of a complex value as a power of 2 value.

Note that the predefined or preconfigured degree of accuracy is, in this example, defined by a number of configurable LUT parameters. Specifically, these LUT parameters include: $\varepsilon_r$, which defines a range of real values centered at a value of 0 within which a real value can be approximated as 0, $\varepsilon_i$ which defines a range of imaginary values centered at a value of 0 within which an imaginary value can be approximated as 0, $\varepsilon_{r,1/2}$ which defines a range of real values centered at a value of ½ within which a real value can be approximated as ½ (i.e., $2^{-1}$), $\varepsilon_{i,1/2}$ which defines a range of imaginary values centered at a value of ½ within which an imaginary value can be approximated as ½ (i.e., $2^{-1}$), $\varepsilon_{r,1/4}$ which defines a range of real values centered at a value of ¼ within which a real value can be approximated as ¼ (i.e., $2^{-2}$), $\varepsilon_{i,1/4}$ which defines a range of imaginary values centered at a value of ¼ within which an imaginary value can be approximated as ¼ (i.e., $2^{-2}$), $\varepsilon_{r,1/8}$ which defines a range of real values centered at a value of ⅛ within which a real value can be approximated as ⅛ (i.e., $2^{-8}$), $\varepsilon_{i,1/8}$ which defines a range of imaginary values centered at a value of ⅛ within which an imaginary value can be approximated as ⅛ (i.e., $2^{-8}$), etc. In this regard, FIG. 8 illustrates several examples of the approximation of the real and/or imaginary components of a complex value as 0 based on $\varepsilon_r$ and $\varepsilon_i$. FIG. 9 is a visual representation of the value ranges defined by the aforementioned parameters within which the real and/or imaginary components of a complex value can be approximated as a power of 2 value. Note that parameters discussed above assume approximation of the real and imaginary components of the complex DPD values as a single power of 2 value. However, in some other embodiments, approximation of the real and imaginary components of the complex DPD values as a combination of two or more power of 2 values, in which case the parameters would include some parameter(s) that defines an acceptable range of values around a particular value represented as a combination of two or more power of 2 values in which a real/imaginary component of a DPD value can be approximated as the combination of two or more power of 2 values.

Returning to FIG. 7, based on this determination, the approximation function 4702 sets the flags that indicate the power modes of the configurable multiplication functions 500 for each LUT entry in each of the LUTs 402-1 through 402-3. Further, for a LUT entry having a component(s) of the respective DPD value that can be approximated as a power of 2 or as a combination of two or more power of 2 values, the approximation function 702 generates the appropriate shifting parameters (e.g., the set of power values $\{p_1, p_2, \ldots, p_k\}$ and the set of sign values $\{s_1, s_2, \ldots, s_k\}$) and stores the shifting parameters in the appropriate entry in the shifting parameter LUTs 412.

In some other embodiments (e.g., embodiments in which the complex multiplication function 400 of FIG. 6 are used), the approximation function 702 has knowledge that the complex multiplication function 400 uses three DPD related values as inputs to the three configurable multiplication functions 600-1 through 600-3, respectively. Namely, in this example, those three DPD related values are: (1) $I_{DPD}$ (2) $Q_{DPD}$, and (3) $I_{DPD}+Q_{DPD}$. For each LUT entry in each of the LUTs 402, for each of these DPD related values, the approximation function 702 determines whether the DPD related value can be approximated as:

- a power of 2 value or a combination of power of 2 values to some predefined or preconfigured degree of accuracy (e.g., a degree of accuracy needed to achieve a desired ACLR),
- (optionally) as a value of 1 to some predefined or preconfigured degree of accuracy (e.g., a degree of accuracy needed to achieve a desired ACLR), or
- (optionally) as a value of 0 to some predefined or preconfigured degree of accuracy (e.g., a degree of accuracy needed to achieve a desired ACLR) as a value of 0.

As discussed above, the predefined or preconfigured degree of accuracy is, in this example, defined by a number of configurable LUT parameters.

Based on this determination, the approximation function 402 sets the flags that indicate the power modes of the configurable multiplication functions 600 for each LUT entry in each of the LUTs 402-1 through 402-3. Further, for LUT entry for which a DPD related value(s) can be approximated as a power of 2 or as a combination of two or more power of 2 values, the approximation function 702 generates the appropriate shifting parameters (e.g., the set of power values $\{p_1, p_2, \ldots, p_k\}$ and the set of sign values $\{s_1, s_2, \ldots, s_k\}$) and stores the shifting parameters in the appropriate entry in the shifting parameter LUTs 412.

FIG. 7 also illustrates one example of the adaptor 700. In this example, the adaptor 700 includes an H-matrix calculation function 704, a θ calculation function 706, and a LUT value calculation function 708. In addition, the adaptor 700 includes an optional H-matrix analysis and modification function 710. The H-matrix calculation function 704 calculates an H-matrix based on a feedback signal (e.g., from the output of the PA 112). Optionally, for each complex value in the H-matrix, the H-matrix analysis and modification function 710 determines whether the real and imaginary components of the complex value can be approximated as a power of 2 value, within some predefined or preconfigured degree of accuracy (e.g., as configured by configurable H-matrix parameters). Real and imaginary component values in the H-matrix that can be approximated as power of 2 values within the predefined or preconfigured degree of accuracy are replaced with corresponding power of 2 values. The modified H-matrix is provided to the 8 calculation function 706 and used, together with the feedback signal, to compute 8. The LUT value calculation function 708 then computes the DPD values for the LUTs 802-1 through 802-3 based on the (modified) H-matrix and 8. Note that the H-matrix calculation function 704 and the 8 calculation function 706 are only examples. The main aspect to be illustrated by the adaptor 700 is that there may be an approximation within the adaptor 700 before the generation of the LUT values. Such an approximation before LUT value generation can be used for any LUT creation based adaptation algorithm and for any data input to the LUT value calculation function 708. Such approximations before LUT value generation may simplify the LUT value generation algorithm calculations and may, therefore, lower overall total power consumption.

Figure 10:
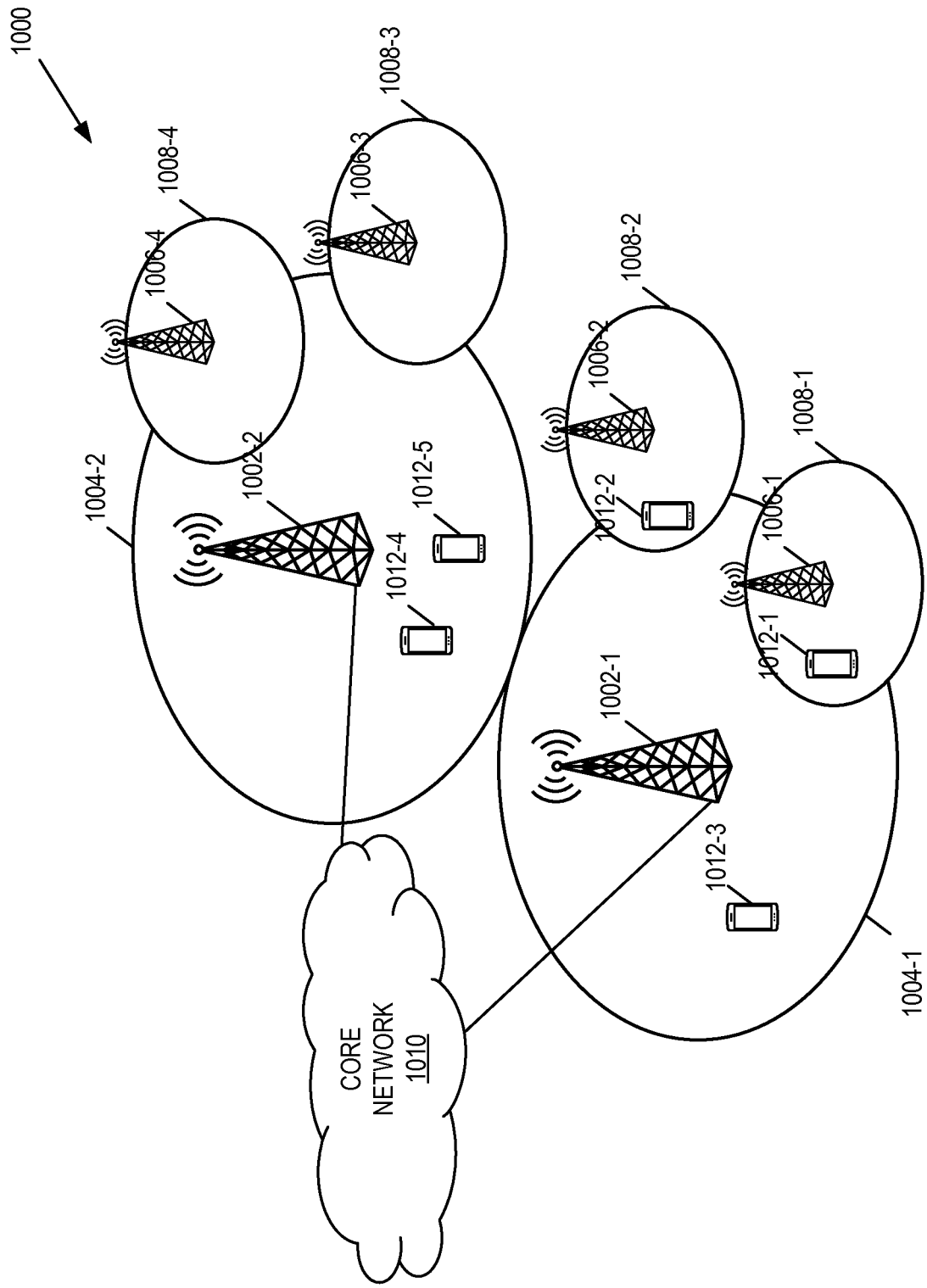
FIG. 10 illustrates one example of a cellular communications network in which embodiments of the present disclosure may be implemented.

FIG. 10 illustrates one example of a cellular communications network 1000 in which embodiments of the present disclosure may be implemented. In the embodiments described herein, the cellular communications network 1000 is a Long Term Evolution (LTE) or Fifth Generation (5G) New Radio (NR) network. In this example, the cellular communications network 1000 includes base stations 1002-1 and 1002-2, which in LTE are referred to as enhanced or evolved Node Bs (eNBs) and in 5G NR are referred to as NR base stations (gNBs), controlling corresponding macro cells 1004-1 and 1004-2. The base stations 1002-1 and 1002-2 are generally referred to herein collectively as base stations 1002 and individually as base station 1002. Likewise, the macro cells 1004-1 and 1004-2 are generally referred to herein collectively as macro cells 1004 and individually as macro cell 1004. The cellular communications network 1000 may also include a number of low power nodes 1006-1 through 1006-4 controlling corresponding small cells 1008-1 through 1008-4. The low power nodes 1006-1 through 1006-4 can be small base stations (such as pico or femto base stations) or Remote Radio Heads (RRHs), or the like. Notably, while not illustrated, one or more of the small cells 1008-1 through 1008-4 may alternatively be provided by the base stations 1002. The low power nodes 1006-1 through 1006-4 are generally referred to herein collectively as low power nodes 1006 and individually as low power node 1006. Likewise, the small cells 1008-1 through 1008-4 are generally referred to herein collectively as small cells 1008 and individually as small cell 1008. The base stations 1002 (and optionally the low power nodes 1006) are connected to a core network 1010.

The base stations 1002 and the low power nodes 1006 provide service to wireless devices 1012-1 through 1012-5 in the corresponding cells 1004 and 1008. The wireless devices 1012-1 through 1012-5 are generally referred to herein collectively as wireless devices 1012 and individually as wireless device 1012. The wireless devices 1012 are also sometimes referred to herein as User Equipment devices (UEs).

In some embodiments, the DPD system 102 disclosed herein may be implemented in a radio node such as, e.g., a wireless device 1012, a base station 1002, or a low power node 1006.

Figure 11:
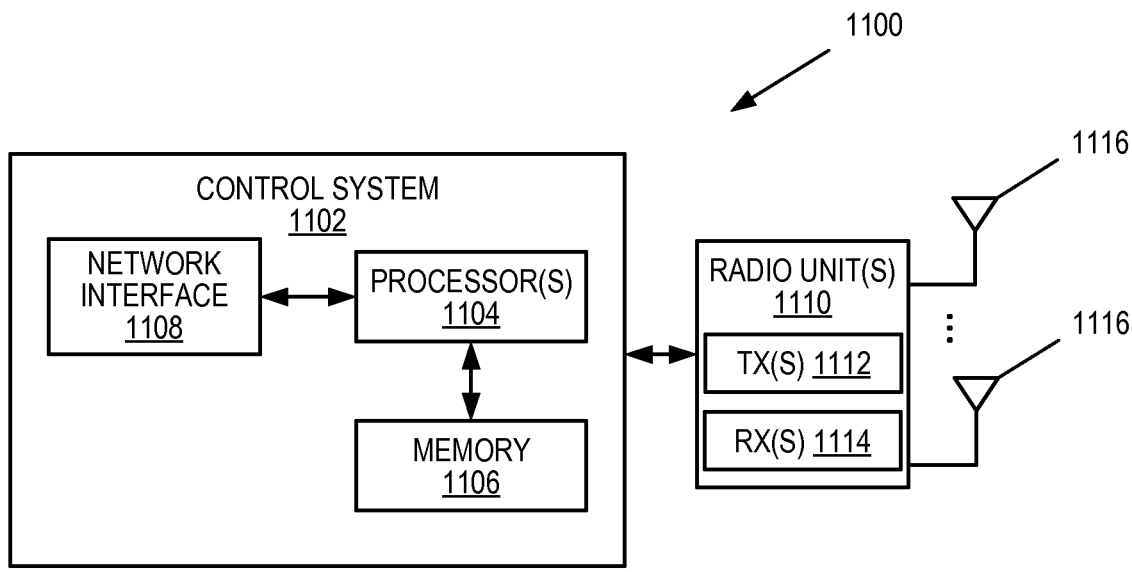
FIG. 11 is a schematic block diagram of a radio access node in which embodiments of the present disclosure may be implemented.

FIG. 11 is a schematic block diagram of a radio access node 1100 according to some embodiments of the present disclosure. The radio access node 1100 may be, for example, a base station 1002 or 1006. As illustrated, the radio access node 1100 includes a control system 1102 that includes one or more processors 1104 (e.g., Central Processing Units (CPUs), Application Specific Integrated Circuits (ASICs), Field Programmable Gate Arrays (FPGAs), and/or the like), memory 1106, and a network interface 1108. The one or more processors 1104 are also referred to herein as processing circuitry. In addition, the radio access node 1100 includes one or more radio units 1110 that each includes one or more transmitters 1112 and one or more receivers 1114 coupled to one or more antennas 1116. In some embodiments, the DPD system 102 described herein is implemented in, e.g., each of the one or more transmitters 1112. The radio units 1110 may be referred to or be part of radio interface circuitry. In some embodiments, the radio unit(s) 1110 is external to the control system 1102 and connected to the control system 1102 via, e.g., a wired connection (e.g., an optical cable). However, in some other embodiments, the radio unit(s) 1110 and potentially the antenna(s) 1116 are integrated together with the control system 1102. The one or more processors 1104 operate to provide one or more functions of a radio access node 1100 as described herein. In some embodiments, the function(s) are implemented in software that is stored, e.g., in the memory 1106 and executed by the one or more processors 1104.

In some embodiments, a computer program including instructions which, when executed by at least one processor, causes the at least one processor to carry out at least some of the functionality of the radio access node 1100 (e.g., at least some of the functionality of the DPD system 102) according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 12:
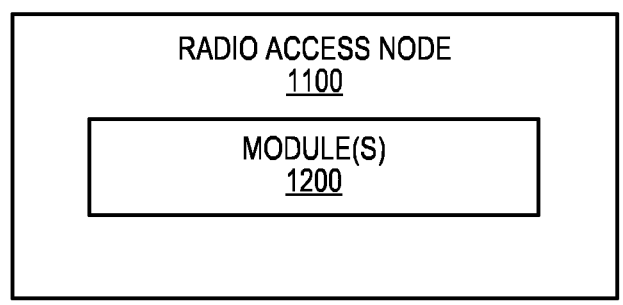
FIG. 12 is a schematic block diagram of the radio access node of FIG. 11 according to some other embodiments of the present disclosure.

FIG. 12 is a schematic block diagram of the radio access node 1100 according to some other embodiments of the present disclosure. The radio access node 1100 includes one or more modules 1200, each of which is implemented in software. The module(s) 1200 provide the functionality of the radio access node 1100 and, in particular, the functionality of the DPD system 102 described herein.

Figure 13:
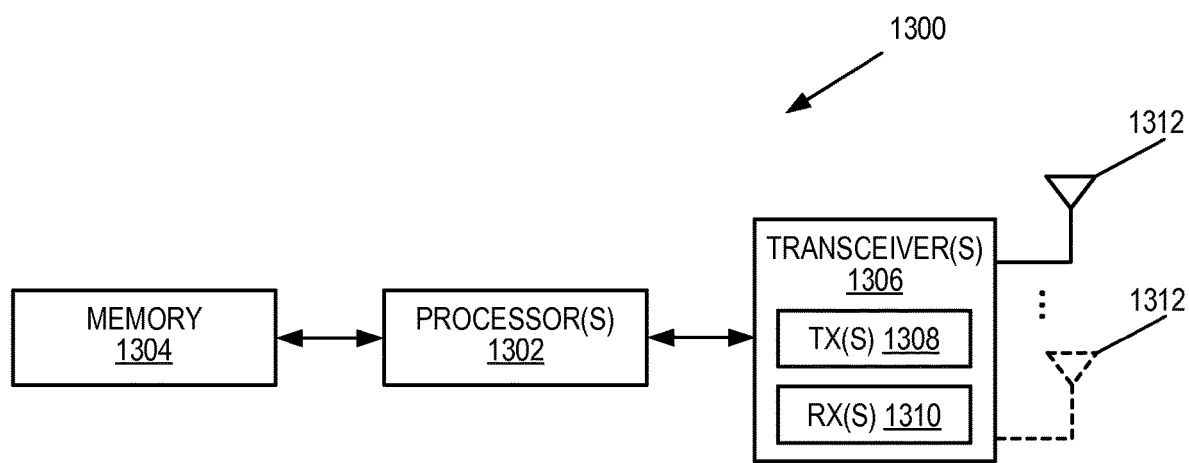
FIG. 13 is a schematic block diagram of a User Equipment device (UE) in which embodiments of the present disclosure may be implemented.

FIG. 13 is a schematic block diagram of a UE 1300 according to some embodiments of the present disclosure. As illustrated, the UE 1300 includes one or more processors 1302 (e.g., CPUs, ASICs, FPGAs, and/or the like), memory 1304, and one or more transceivers 1306 each including one or more transmitters 1308 and one or more receivers 1310 coupled to one or more antennas 1312. In some embodiments, the DPD system 102 described herein is implemented in, e.g., each of the one or more transmitters 1308. The processors 1302 are also referred to herein as processing circuitry. The transceivers 1306 are also referred to as radio circuitry. In some embodiments, the functionality of the UE 1300 described above may be fully or partially implemented in software that is, e.g., stored in the memory 1304 and executed by the processor(s) 1302. Note that the UE 1300 may include additional components not illustrated in FIG. 13 such as, e.g., one or more user interface components (e.g., a display, buttons, a touch screen, a microphone, a speaker(s), and/or the like), a power supply (e.g., a battery and associated power circuitry), etc.

In some embodiments, a computer program including instructions which, when executed by at least one processor, causes the at least one processor to carry out the functionality of the UE 1300 (e.g., at least some of the functionality of the DPD system 102) according to any of the embodiments described herein is provided. In some embodiments, a carrier comprising the aforementioned computer program product is provided. The carrier is one of an electronic signal, an optical signal, a radio signal, or a computer readable storage medium (e.g., a non-transitory computer readable medium such as memory).

Figure 14:
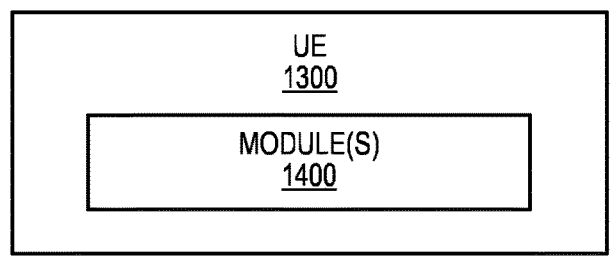
FIG. 14 is a schematic block diagram of the UE of FIG. 13 according to some other embodiments of the present disclosure.

FIG. 14 is a schematic block diagram of the UE 1300 according to some other embodiments of the present disclosure. The UE 1300 includes one or more modules 1400, each of which is implemented in software. The module(s) 1400 provide the functionality of the UE 1300 and, in particular, the functionality of the DPD system 102 described herein.

At least some of the following abbreviations may be used in this disclosure. If there is an inconsistency between abbreviations, preference should be given to how it is used above. If listed multiple times below, the first listing should be preferred over any subsequent listing(s).

5G Fifth Generation
ACLR Adjacent Channel Leakage-Power Ratio
ASIC Application Specific Integrated Circuit
CPU Central Processing Unit
D/A Digital-to-Analog
DPD Digital Predistortion
DRF Digital Radio Frequency
eNB Enhanced or Evolved Node B
gNB New Radio Base Station
LTE Long Term Evolution
LUT Look-Up Table
NR New Radio
PA Power Amplifier
RRH Remote Radio Head
UE User Equipment Those skilled in the art will recognize improvements and modifications to the embodiments of the present disclosure. All such improvements and modifications are considered within the scope of the concepts disclosed herein.

What is claimed is:

1. A system comprising:
a Digital Predistortion, DPD, system for digitally predistorting an input signal to provide an output signal, the DPD system comprising:
  a DPD actuator comprising:
    one or more configurable multiplication functions each configurable to operate in different power modes comprising:
      a first power mode in which the configurable multiplication function multiplies a first value related to an input sample of the input signal and a second value related to a respective DPD value to provide an output value; and
      a second power mode in which the configurable multiplication function outputs, as the output value, an approximation of a multiplication of the first value and the second value.

2. The system of claim 1 wherein:
the input sample and the respective DPD value are complex values;
the first value related to the input sample is either a real component or an imaginary component of the input sample; and
the second value related to the respective DPD value is either a real component or an imaginary component of the respective DPD value.

3. The system of claim 1 wherein:
the input sample and the respective DPD value are complex values;
the first value related to the input sample is either a sum of a real component and an imaginary component of the input sample or the real component of the input sample; and
the second value related to the DPD value is either a real component of the respective DPD value, an imaginary component of the respective DPD value, or a sum of the real component and the imaginary component of the respective DPD value.

4. The system of claim 1 wherein the DPD actuator further comprises a controller that is operable to, for each input sample of a plurality of input samples of the input signal, configure each of the one or more configurable multiplication functions in one of the different power modes selected based on whether the second value related to the respective DPD value can be approximated as a power of 2 value.

5. The system of claim 1 wherein the DPD actuator further comprises a controller that is operable to, for each input sample of a plurality of input samples of the input signal, configure each of the one or more configurable multiplication functions in one of the different power modes selected based on whether the selected value related to the respective DPD value can be approximated as a combination of power of 2 values.

6. The system of claim 4 wherein:
each configurable multiplication function of the one or more configurable multiplication functions comprises:
multiplication circuitry operable to multiply a first value related to an input sample and a second value related a respective DPD value to provide an output value; and
shifting circuitry operable to process a first value related to an input sample to provide an approximation of a multiplication of the first value related to the input sample and a second value related to a respective DPD value based on one or more bit shifting operations; and
the controller is further operable to, for each input sample of the plurality of input samples of the input signal, for each configurable multiplication function of the one or more configurable multiplication functions:
activate the multiplication circuitry and deactivate the shifting circuitry to configure the configurable multiplication function in the first power mode if the one of the different power modes to be used by the configurable multiplication function for the input sample is the first power mode; and
deactivate the multiplication circuitry and activate the shifting circuitry to configure the configurable multiplication function in the second power mode if the one of the different power modes to be used by the configurable multiplication function for the input sample is the second power mode.

7. The system of claim 1 wherein the DPD actuator further comprises:
a Look-Up Table, LUT, comprising a plurality of LUT entries comprising a plurality of DPD values, respectively, wherein the DPD actuator stores information that, for each LUT entry of the plurality of LUT entries:
for each configurable multiplication function of the one or more configurable multiplication functions, indicates one of the different power modes to be used by the configurable multiplication function when the LUT entry is selected for output by the LUT;
selection circuitry operable to, for each input sample of a plurality of input samples of the input signal, select a selected LUT entry from among the plurality of LUT entries based on a power of the input sample; and
a controller that is operable to, for each input sample of the plurality of input samples of the input signal, for each configurable multiplication function of the one or more configurable multiplication functions:
obtain the information that indicates the one of the different power modes to be used by the configurable multiplication function for the selected LUT entry; and
configure the configurable multiplication function in the one of the different power modes to be used by the configurable multiplication function for the selected LUT entry.

8. The system of claim 7 wherein the DPD system further comprises an adaptation system comprising:
an adaptor operable to generate the plurality of DPD values for the plurality of LUT entries and store the plurality of DPD values in the plurality of LUT entries in the LUT; and
an approximation function operable to, for each LUT entry of the plurality of LUT entries:
generate and store, for the LUT entry, the information that indicates for each configurable multiplication function of the one or more configurable multiplication functions, the one of the different power modes that is to be used by the configurable multiplication function when the LUT entry is selected for output by the LUT.

9. The system of claim 8 wherein the adaptor comprises a modification function and a LUT value generation function operable to generate the plurality of DPD values for the plurality of LUT entries, wherein the modification function is operable to approximate each of at least some input values of the LUT value generation function as either a power of 2 value or a combination of two or more power of 2 values.

10. The system of claim 7 wherein:
each configurable multiplication function of the one or more configurable multiplication functions comprises:
multiplication circuitry operable to multiply a first value related to an input sample and a second value related to a respective DPD value to provide an output value; and
shifting circuitry operable to process a first value related to an input sample to provide an approximation of a multiplication of the first value related to the input sample and a second value related to a respective DPD value based on one or more bit shifting operations; and
for each input sample of the plurality of input samples of the input signal, the controller is further operable to, for each configurable multiplication function of the one or more configurable multiplication functions:
activate the multiplication circuitry and deactivate the shifting circuitry to configure the configurable multiplication function in the first power mode if the one of the different power modes to be used by the configurable multiplication function for the selected LUT entry is the first power mode; and
deactivate the multiplication circuitry and activate the shifting circuitry to configure the configurable multiplication function in the second power mode if the one of the different power modes to be used by the configurable multiplication function for the selected LUT entry is the second power mode.

11. The system of claim 10 wherein the DPD system further comprises an adaptation system comprising:
an adaptor operable to generate the plurality of DPD values for the plurality of LUT entries and store the plurality of DPD values in the plurality of LUT entries in the LUT; and
an approximation function operable to, for each LUT entry of the plurality of LUT entries:
generate and store, for the LUT entry, the information that indicates for each configurable multiplication function of the one or more configurable multiplication functions, the one of the different power modes that is to be used by the configurable multiplication function when the LUT entry is selected for output by the LUT.

12. The system of claim 10 wherein:
for each configurable multiplication function of the one or more configurable multiplication functions:
the different power modes further comprise a third power mode in which a first value related to an input sample is provided as an output value such that the configurable multiplication function is bypassed; and
the configurable multiplication function further comprises bypass circuitry operable to provide a first value related to an input sample provided as an input to the configurable multiplication function as an output value of the configurable multiplication function; and
for each input sample of the plurality of input samples of the input signal, the controller, is further operable to, for each configurable multiplication function of the one or more configurable multiplication functions:
activate the multiplication circuitry, deactivate the shifting circuitry, and deactivate the bypass circuitry to configure the configurable multiplication function in the first power mode if the one of the different power modes to be used by the configurable multiplication function for the selected LUT entry is the first power mode;
deactivate the multiplication circuitry, activate the shifting circuitry, and deactivate the bypass circuitry to configure the configurable multiplication function in the second power mode if the one of the different power modes to be used by the configurable multiplication function for the selected LUT entry is the second power mode; and
deactivate the multiplication circuitry, deactivate the shifting circuitry, and activate the bypass circuitry to configure the configurable multiplication function in the third power mode if the one of the different power modes to be used by the configurable multiplication function for the selected LUT entry is the third power mode.

13. The system of claim 1 wherein the different power modes further comprise a third power mode in which a first value related an input sample that is provided as an input to the configurable multiplication function is provided as an output value of the configurable multiplication function.

14. The system of claim 1 wherein the DPD actuator is further operable to:
configure one of the one or more configurable multiplication functions in the first power mode when processing a first input sample of the input signal; and
reconfiguring the one of the one or more configurable multiplication functions in the second power mode when processing a second input sample of the input signal.

15. A method of digitally predistorting an input signal to provide an output signal, comprising:
dynamically configuring each configurable multiplication function of one or more configurable multiplication functions in a Digital Predistortion, DPD, actuator of a DPD system to operate in different power modes comprising:
a first power mode in which the configurable multiplication function multiplies a first value related to an input sample of the input signal and a second value related to a respective DPD value to provide an output value; and a second power mode in which the configurable multiplication function outputs, as the output value, an approximation of a multiplication of the first value and the second value; and
digitally predistorting the input signal using the DPD actuator.

16. The method of claim 15 wherein:
the input sample and the respective DPD value are complex values;
the first value related to the input sample is either a real component or an imaginary component of the input sample; and
the second value related to the respective DPD value is either a real component or an imaginary component of the respective DPD value.

17. The method of claim 15 wherein:
the input sample and the respective DPD value are complex values;
the first value related to the input sample is either a sum of a real component and an imaginary component of the input sample or the real component of the input sample; and
the second value related to the respective DPD value is either a real component of the respective DPD value, an imaginary component of the respective DPD value, or a sum of the real component and the imaginary component of the respective DPD value.

18. The method of claim 15 wherein, for each configurable multiplication function of the one or more configurable multiplication functions, dynamically configuring the configurable multiplication function comprises, for each input sample of a plurality of input samples of the input signal, configuring the configurable multiplication function in one of the different power modes selected based on whether the second value related to the respective DPD value can be approximated as a power of 2 value.

19. The method of claim 15 wherein, for each configurable multiplication function of the one or more configurable multiplication functions, dynamically configuring the configurable multiplication function comprises, for each input sample of a plurality of input samples of the input signal, configuring the configurable multiplication function in one of the different power modes selected based on whether the second value related to the respective DPD value can be approximated as a combination of power of 2 values.

20. The method of claim 15 wherein the DPD actuator further comprises:
a Look-Up Table, LUT, comprising a plurality of LUT entries comprising a plurality of DPD values, respectively, wherein the DPD actuator stores information that, for each LUT entry of the plurality of LUT entries:
for each configurable multiplication function of the one or more configurable multiplication functions, indicates one of the different power modes to be used by the configurable multiplication function when the LUT entry is selected for output by the LUT; and
the method further comprises, for each input sample of a plurality of input samples of the input signal, selecting a selected LUT entry from among the plurality of LUT entries based on a power of the input sample;
wherein, for each configurable multiplication function of the one or more configurable multiplication functions, dynamically configuring the configurable multiplication function comprises, for each input sample of a plurality of input samples of the input signal:

obtaining the information that indicates the one of the different power modes to be used by the configurable multiplication function for the selected LUT entry; and configuring the configurable multiplication function in the one of the different power modes to be used by the configurable multiplication function for the selected LUT entry.

21. The method of claim 20 further comprising:

generating the plurality of DPD values for the plurality of LUT entries and storing the plurality of DPD values in the plurality of LUT entries in the LUT; and for each LUT entry of the plurality of LUT entries:
generating and storing, for the LUT entry, the information that indicates, for each configurable multiplication function of the one or more configurable multiplication functions, the one of the different power modes is to be used by the configurable multiplication function when the LUT entry is selected for output by the LUT.

22. The method of claim 21 wherein generating the plurality of DPD values comprises approximating each of at least some input values used for generating the DPD values as either a power of 2 value or a combination of two or more power of 2 values.

23. The method of claim 20 wherein:

each configurable multiplication function of the one or more configurable multiplication functions comprises:
multiplication circuitry operable to multiply a first value related to an input sample and a second value related to a respective DPD value to provide an output value;

shifting circuitry operable to process a first value related to an input sample to provide an approximation of a multiplication of the first value related to the input sample and a second value related to a respective DPD value based on one or more bit shifting operations; and for each configurable multiplication function of the one or more configurable multiplication functions, dynamically configuring the configurable multiplication function comprises, for each input sample of a plurality of input samples of the input signal:

activating the multiplication circuitry and deactivating the shifting circuitry to configure the configurable multiplication function in the first power mode if the one of the different power modes to be used by the configurable multiplication function for the selected LUT entry is the first power mode; and deactivating the multiplication circuitry and activating the shifting circuitry to configure the configurable multiplication function in the second power mode if the one of the different power modes to be used by the configurable multiplication function for the selected LUT entry is the second power mode.

24. The method of claim 15 wherein the different power modes further comprise a third power mode in which a first value related to an input sample provided as an input to the configurable multiplication function is provided as an output value of the configurable multiplication function.

* * * * *